United States Patent
Solomon et al.

(10) Patent No.: US 9,437,757 B2
(45) Date of Patent: *Sep. 6, 2016

(54) METHODS FOR WET CHEMISTRY POLISHING FOR IMPROVED LOW VISCOSITY PRINTING IN SOLAR CELL FABRICATION

(71) Applicant: SunPower Corporation, San Jose, CA (US)

(72) Inventors: Genevieve A. Solomon, Palo Alto, CA (US); Scott Harrington, Oakland, CA (US); Kahn Wu, San Francisco, CA (US); Paul Loscutoff, Castro Valley, CA (US); Junbo Wu, San Jose, CA (US); Steven Edward Molesa, San Jose, CA (US)

(73) Assignee: SunPower Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/744,962

(22) Filed: Jun. 19, 2015

(65) Prior Publication Data

US 2015/0364625 A1    Dec. 17, 2015

Related U.S. Application Data

(62) Division of application No. 13/801,192, filed on Mar. 13, 2013, now Pat. No. 9,082,925.

(51) Int. Cl.
*H01L 21/00* (2006.01)
*H01L 21/20* (2006.01)
(Continued)

(52) U.S. Cl.
CPC . *H01L 31/022441* (2013.01); *H01L 31/02363* (2013.01); *H01L 31/18* (2013.01); *H01L 31/1804* (2013.01); *Y02E 10/547* (2013.01); *Y02P 70/521* (2015.11)

(58) Field of Classification Search
CPC . H01L 33/00; H01L 31/18; H01L 31/02441; H01L 21/00; H01L 31/02; H01L 31/04; H01L 21/20
USPC .......... 438/72, 71, 57, 94–96, 664–665, 65, 438/98, 87, 29, 609, 251–256, 261; 257/432, 460, 466, 618, 436, 21, 257/E31.13, E27.123–E27.126; 136/252–256, 261

See application file for complete search history.

(56) References Cited

U.S. PATENT DOCUMENTS

| | | | |
|---|---|---|---|
| 7,468,485 B1* | 12/2008 | Swanson | H01L 31/03682 136/243 |
| 8,658,454 B2* | 2/2014 | Pass | H01L 21/2257 136/255 |

(Continued)

FOREIGN PATENT DOCUMENTS

JP    2006339499    * 12/2014

OTHER PUBLICATIONS

Machine English translation of JP2006-339499, Dec. 2014, Shuzo Ishii.*

(Continued)

*Primary Examiner* — Yuanda Zhang
*Assistant Examiner* — Sheikh Maruf
(74) *Attorney, Agent, or Firm* — Blakely Sokoloff Taylor Zafman LLP

(57) ABSTRACT

A method of fabricating a solar cell is disclosed. The method includes forming a polished surface on a silicon substrate and forming a first flowable matrix in an interdigitated pattern on the polished surface, where the polished surface allows the first flowable matrix to form an interdigitated pattern comprising features of uniform thickness and width. In an embodiment, the method includes forming the silicon substrate using a method such as, but not limited to, of diamond wire or slurry wafering processes. In another embodiment, the method includes forming the polished surface on the silicon substrate using a chemical etchant such as, but not limited to, sulfuric acid ($H_2SO_4$), acetic acid ($CH_3COOH$), nitric acid ($HNO_3$), hydrofluoric acid (HF) or phosphoric acid ($H_3PO_4$). In still another embodiment, the etchant is an isotropic etchant. In yet another embodiment, the method includes providing a surface of the silicon substrate with at most 500 nanometer peak-to-valley roughness.

20 Claims, 20 Drawing Sheets

(51) Int. Cl.
*H01L 31/0224* (2006.01)
*H01L 31/18* (2006.01)
*H01L 31/0236* (2006.01)

(56) References Cited

U.S. PATENT DOCUMENTS

| | | | |
|---|---|---|---|
| 2001/0029978 A1* | 10/2001 | Nakai | H01L 31/035281 136/258 |
| 2004/0259335 A1* | 12/2004 | Narayanan | H01L 31/0236 438/584 |
| 2006/0130891 A1* | 6/2006 | Carlson | H01L 31/02168 136/256 |
| 2007/0238216 A1* | 10/2007 | Park | H01L 31/02168 438/57 |
| 2007/0256728 A1 | 11/2007 | Cousins | |
| 2008/0210294 A1* | 9/2008 | Moslehi | H01L 31/042 136/251 |
| 2008/0233720 A1* | 9/2008 | Carberry | C30B 29/06 438/492 |
| 2009/0085095 A1 | 4/2009 | Kamath et al. | |
| 2009/0235980 A1* | 9/2009 | Nishida | H01L 31/02167 136/256 |
| 2010/0015751 A1 | 1/2010 | Weidman et al. | |
| 2010/0052105 A1 | 3/2010 | Henley et al. | |
| 2010/0055822 A1 | 3/2010 | Weidman et al. | |
| 2010/0193016 A1* | 8/2010 | Fernandez | H01L 31/022425 136/255 |
| 2011/0120537 A1 | 5/2011 | Liu et al. | |
| 2011/0174362 A1 | 7/2011 | Tanner et al. | |
| 2012/0006380 A1* | 1/2012 | Mikami | H01L 31/042 136/244 |
| 2012/0048356 A1 | 3/2012 | Jee et al. | |
| 2012/0067406 A1* | 3/2012 | Pass | H01L 21/2257 136/252 |
| 2012/0097244 A1* | 4/2012 | Adachi | H01L 31/022483 136/256 |
| 2012/0125424 A1 | 5/2012 | Wenham et al. | |
| 2012/0171799 A1 | 7/2012 | Rim et al. | |
| 2012/0222736 A1* | 9/2012 | Gee | H01L 31/022433 136/256 |
| 2012/0225517 A1 | 9/2012 | Zhang et al. | |
| 2012/0247560 A1 | 10/2012 | Rim et al. | |
| 2012/0288985 A1 | 11/2012 | Moriceau et al. | |
| 2013/0025678 A1 | 1/2013 | Shim et al. | |
| 2013/0199606 A1* | 8/2013 | Sheng | H01L 31/1804 136/256 |
| 2013/0228221 A1* | 9/2013 | Moslehi | H01L 31/022441 136/256 |
| 2014/0162399 A1* | 6/2014 | Cudzinovic | C25D 5/10 438/98 |
| 2014/0284083 A1 | 9/2014 | Srinivas et al. | |

OTHER PUBLICATIONS

First Action Interview Pilot Program Pre-Interview Communication from U.S. Appl. No. 13/801,192 mailed Sep. 10, 2014, 5 pgs.

International Search Report and Written Opinion from PCT/US2014/025042 mailed Jul. 22, 2014, 14 pgs.

First Action Interview Office Action from U.S. Appl. No. 13/801,192 mailed Nov. 20, 2014, 7 pgs.

International Preliminary Report on Patentability from PCT/US2014/025042 mailed Sep. 24 2015, 11 pgs.

* cited by examiner

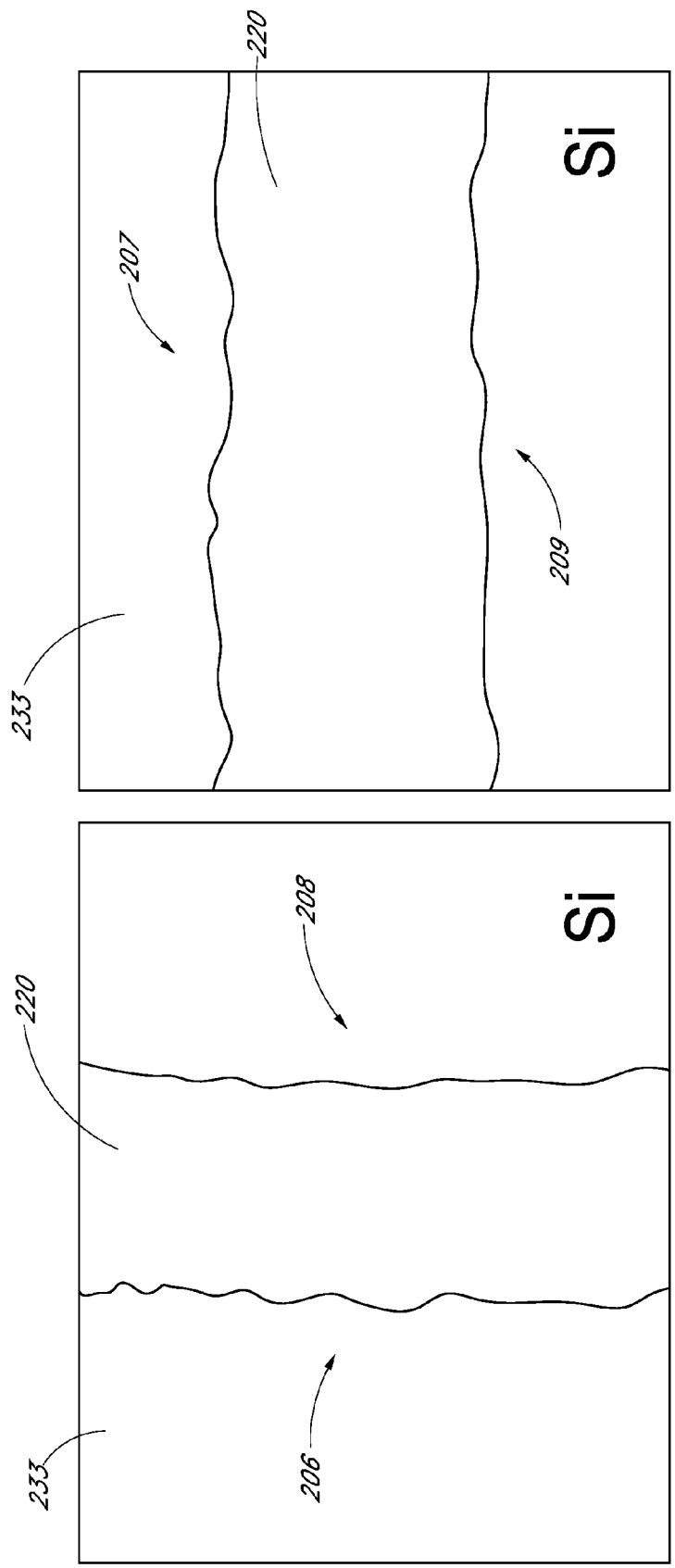

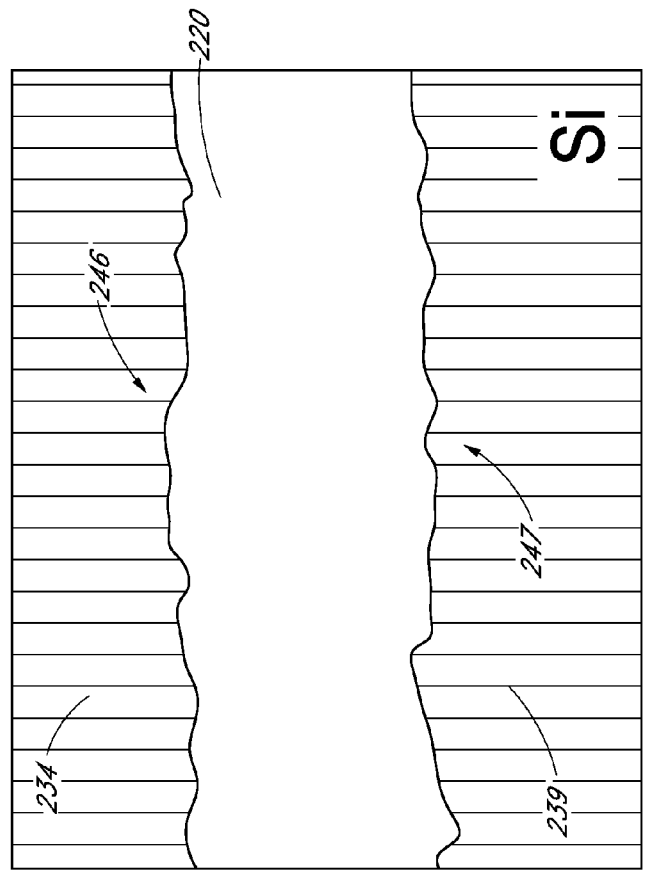
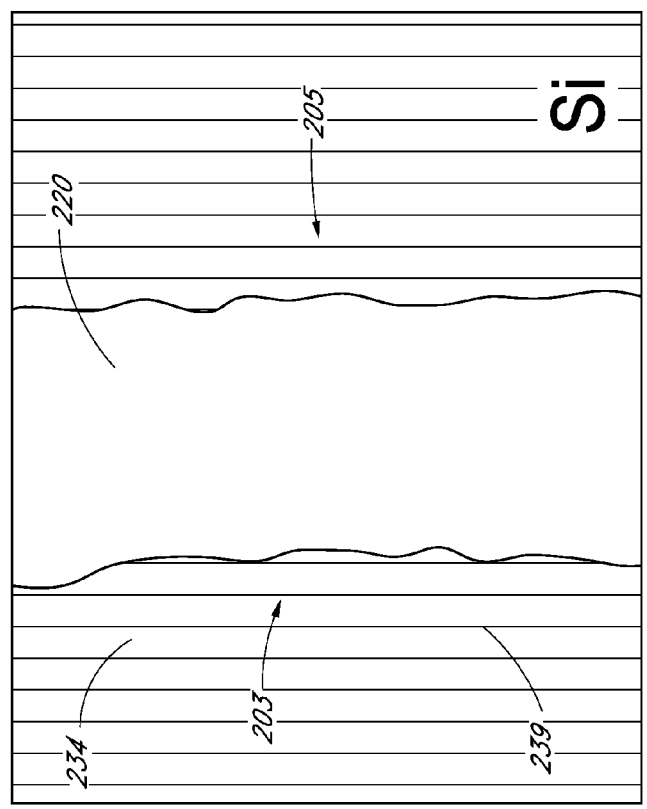
FIG. 13D
FIG. 13C

METHODS FOR WET CHEMISTRY POLISHING FOR IMPROVED LOW VISCOSITY PRINTING IN SOLAR CELL FABRICATION

CROSS-REFERENCE TO RELATED APPLICATIONS

This application is a divisional of U.S. patent application Ser. No. 13/801,192, filed on Mar. 13, 2013, the entire contents of which are hereby incorporated by reference herein.

TECHNICAL FIELD

Embodiments of the subject matter described herein relate generally to solar cell manufacture. More particularly, embodiments of the subject matter relate to etching and polishing solar cells and techniques for manufacture.

BACKGROUND

Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell. However, improvements in the processes used to fabricate solar cells are still needed.

BRIEF SUMMARY

A method for forming a first flowable matrix on a solar cell is disclosed. The method includes forming a polished surface on a silicon substrate and forming a first flowable matrix in an interdigitated pattern on the polished surface, the interdigitated pattern comprising features of uniform thickness and width. In an embodiment, the method includes forming the silicon substrate using a method such as, but not limited to, diamond wire or slurry wafering processes. The method also includes etching a silicon substrate using a chemical etchant such as, but not limited to, sulfuric acid ($H_2SO_4$), acetic acid ($CH_3COOH$), nitric acid ($HNO_3$), hydrofluoric acid (HF) or phosphoric acid ($H_3PO_4$). In an embodiment, the method includes providing a surface of the silicon substrate with at most 500 nanometer peak-to-valley roughness. In another embodiment, the method includes providing a first flowable matrix including a material having a viscosity in the range of 1-25 centipoise (cP). In still another embodiment, the method includes providing a first flowable matrix including a material such as, but not limited to, an etch resist ink, a flowable amorphous silicon and a flowable polysilicon. In yet another embodiment, the method includes a first flowable matrix including a first dopant material having a first dopant source. In an embodiment, the method includes heating the silicon substrate and the first dopant material to a temperature sufficient to cause the first dopant source to diffuse into the silicon substrate. In still another embodiment, the method includes forming a first doped region subsequent to heating the first flowable matrix and the silicon substrate. In yet another embodiment, the method further includes forming a second flowable matrix in an interdigitated pattern on the polished surface, the interdigitated pattern comprising features of uniform thickness and width. In an embodiment, the second flowable matrix includes a second dopant material having a second dopant source. In another embodiment, the method includes heating the silicon substrate and the second dopant material to a temperature sufficient to cause the second dopant source to diffuse into the silicon substrate. In still another embodiment, the method includes forming a second doped region subsequent to heating the second dopant material and the silicon substrate. In yet another embodiment, the method includes a first and second dopant source having a dopant such as, but not limited to, boron or phosphorous. In yet another embodiment, the method also includes providing a first and second flowable matrix composed of a first and second metal paste. In an embodiment, the method includes heating the first and second metal paste to form a first metal layer and plating a second metal layer on the first metal layer, where the first metal layer electrically couples the second metal layer to the first and second doped regions. In another embodiment, the method further includes forming the first flowable matrix using a method such as, but not limited to, ink-jet printing, screen printing or spin coating. In still another embodiment, etching the silicon substrate includes isotropically etching the silicon substrate to form the polished surface. In yet another embodiment, the polished surface is instead a semi-polished surface. In an embodiment, a semi-polished surface is a surface of the silicon substrate with at least 8 microns etched away from the silicon substrate. In another embodiment, isotropically etching the silicon substrate allows for the first flowable matrix to form an interdigitated pattern having evenly printed lines of a uniform thickness. In still another embodiment, prior to isotropically etching the silicon substrate, the method includes etching the silicon substrate using an anisotropic etching process to remove excess silicon and form a smoothened surface on the silicon substrate. In yet another embodiment, the method includes anisotropically etching the silicon substrate with Potassium Hydroxide (KOH). In an embodiment, the etchants discussed above are mixed with deionized (DI) water.

A method of fabricating a solar cell is disclosed. The method includes providing a solar cell having a front side which faces the sun during normal operation and a back side opposite the front side. The method also includes forming a polished surface on a silicon substrate using an etchant, where the polished surface has at most 500 nanometer peak-to-valley roughness and is formed on the back side of the solar cell. The method includes depositing first and second dopant materials, each material having a viscosity in the range of 1-25 centipoise (cP), in an interdigitated pattern on the polished surface, the first and second dopant materials including a first and second dopant source, respectively, where the polished surface allows the first and second dopant materials to form an interdigitated pattern comprising features of uniform thickness and width. In an embodiment, the first and second dopant materials are deposited by industrial printing methods over the polished surface. The method includes heating the silicon substrate and the first and second dopant materials to a temperature sufficient to cause the first and second dopant sources to diffuse into the silicon substrate. In an embodiment, heating the silicon substrate and the first and second dopant materials to a temperature sufficient to cause the first and second dopant sources to diffuse into the silicon substrate forms a first and second doped regions. The method also includes depositing a first dielectric layer over the first and second doped regions. In an embodiment, the first dielectric layer is composed of silicon nitride (SiN) or any material commonly used to form anti-reflective regions for solar cells. The method includes forming a plurality of contact openings within the first dielectric layer. In an embodiment, forming the plurality of contact openings includes using a wet-etching technique or laser ablation process. The method further includes forming a first metal layer established through the contact openings over the first and second doped regions, where the first metal layer includes electrically connected grids to the first and second doped regions on the back side and plating a second metal layer on the first metal layer, where the first metal layer electrically couples the second metal layer to the first and second doped regions. In an embodiment, the method includes forming the silicon substrate using a method such as, but not limited to, diamond wire or slurry wafering processes. In another embodiment, the method includes etching a silicon substrate using a chemical etchant such as, but not limited to, sulfuric acid ($H_2SO_4$), acetic acid ($CH_3COOH$), nitric acid ($HNO_3$), hydrofluoric acid (HF) or phosphoric acid ($H_3PO_4$). In still another embodiment, etching the silicon substrate includes etching the silicon substrate using an isotropic etchant to form the polished surface. In another embodiment, isotropically etching the silicon substrate allows for the first dopant material to form an interdigitated pattern having evenly printed lines of a uniform thickness. In still another embodiment, the method includes anisotropically etching the silicon substrate to form a smoothened surface prior to isotropically etching.

Another method of fabricating a solar cell is disclosed. The method includes providing a solar cell having a front side which faces the sun during normal operation and a back side opposite the front side. The method also includes forming a polished surface on a silicon substrate using an isotropic etchant, where the polished surface has at most 500 nanometer peak-to-valley roughness and is formed on the back side of the solar cell. The method includes forming first and second doped regions on the back side of the solar cell. The method includes depositing a first dielectric layer over the first and second doped regions. In an embodiment, the first dielectric layer is an anti-reflective layer over the back side of the solar cell. The method includes forming a plurality of contact openings within the first dielectric layer. The method also includes depositing a first metal paste to at least fill at least one contact opening established through the dielectric layer formed over the first and second doped regions, where the topography of the first and second doped regions is conformal with the polished surface of the silicon substrate. The method includes depositing a second metal paste to connect more than one contact opening filled with the first metal paste to form interdigitated patterns over the dielectric layer on the back side, where the second metal paste is deposited by industrial printing methods over the polished surface such that the topography of the second metal paste is conformal with the polished surface of the silicon substrate. The method includes curing the first and second metal paste to form a first metal layer including electrically connected grids to the first and second doped regions underneath the dielectric layer on the back side. The method also includes plating a second metal layer on the first metal layer, where the first metal layer electrically couples the second metal layer to the first and second doped regions. In an embodiment, the method includes forming the silicon substrate using a method such as, but not limited to diamond wire and slurry wafering processes. In an embodiment, the method includes etching the silicon substrate using a chemical etchant such as, but not limited to, sulfuric acid ($H_2SO_4$), acetic acid ($CH_3COOH$), nitric acid ($HNO_3$), hydrofluoric acid (HF) or phosphoric acid ($H_3PO_4$). In another embodiment, the etchant is an isotropic etchant.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 13A-13D are a plan view of the solar cell of FIG. 5 in accordance with an embodiment of the method for forming a first flowable matrix on a solar cell of FIGS. 5-12;

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques for improving manufacturing processes related to etching, cleaning and polishing of solar cells are beneficial as these are an intrinsic part of the standard solar cell fabrication process. Such techniques may improve the printed line thickness and linearity on a solar cell during deposition of a printable medium. These or other similar embodiments are described below.

Additionally, numerous specific details are set forth, such as specific process flow operations, in order to provide a thorough understanding of the method and embodiments thereof. It will be apparent to one skilled in the art that the method and its embodiments may be practiced without these specific details. In other instances, well-known fabrication techniques, such as lithographic and etch techniques, are not described in detail in order to not unnecessarily obscure the presented methods. Furthermore, it is to be understood that the various embodiments shown in the figures are illustrative representations and are not necessarily drawn to scale.

As generally known in the art, methods for fabricating a solar cell can include providing a silicon substrate, forming doped regions within the silicon substrate, forming contact regions on the doped regions and plating a metal layer on the contact regions, where an external load is connected to positive and negative pads along the metal layer to draw current generated by the solar cell. Thus, forming doped regions on a silicon substrate is an integral part of the solar cell fabrication process. Various methods for forming doped regions are known. Standard methods for forming a flowable matrix on a silicon substrate in preparation to forming doped regions are depicted in FIGS. 1-4 and discussed below.

Figure 1:
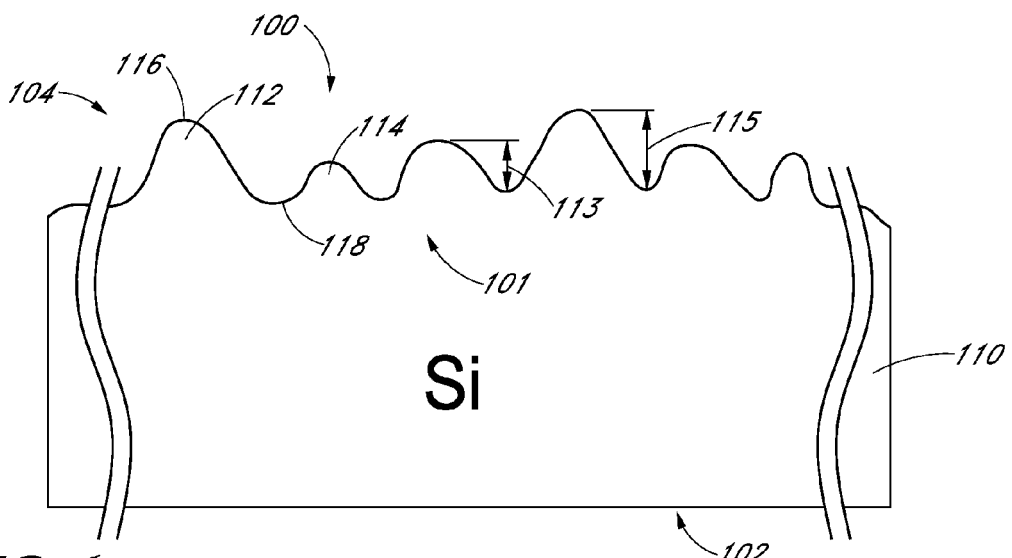
FIGS. 1-3 are cross-sectional representations of a standard process for forming a first flowable matrix on a solar cell.

FIG. 1 illustrates a solar cell used in conjunction with a standard process of forming a first flowable matrix on a solar cell. The solar cell 100 can include a front side 102 which faces the sun during normal operation and a back side 104 opposite the front side 102. The solar cell 100 can also include a silicon substrate 110. The silicon substrate 110 can include a non-polished surface 101 on the back side 104 of the silicon substrate 110. The non-polished surface 101 can have surface features such as unevenly shaped regions, including elevated regions 112 and lowered regions 114. The elevated and lowered regions 112, 114 can also include a peak 116 at the highest point of both regions and a valley 118 being the lowest point between unevenly shaped regions. Thus, the height 113, 115 respectively, for elevated and lowered regions in general can be measured by a peak-to-valley distance. Also, the height of surface features can vary and be on the average greater than 500 nanometers.

Figure 2:
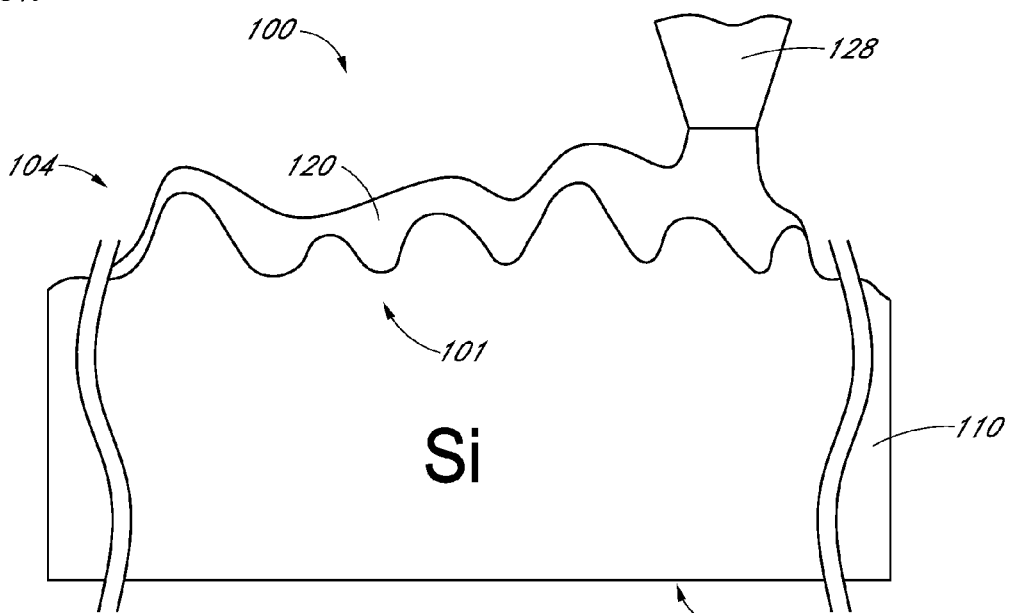

With reference to FIG. 2, a standard process for forming a first flowable matrix on a solar cell is shown. The standard process can include using industrial printing methods such as an ink-jet printer with a nozzle 128, to deposit a first flowable matrix 120 on the non-polished surface 101 on the back side 104 of the silicon substrate 110. A general requirement for ink-jet printing on a substrate is to maintain a printed line quality, where printed line quality can be measured in terms of its deposited line thickness and printed line width consistency on a substrate. Also, the first flowable matrix, or flowlable matrix, can have any number of different interpretations, where it is used here to include the following: etch resist ink, a flowable amorphous silicon, a flowable polysilicon and various low-viscosity printable dopants. The first flowable matrix is not necessarily limited to the described and can also include other substances and classes of materials as well, such as high-viscosity printable materials and the like.

Figure 3:
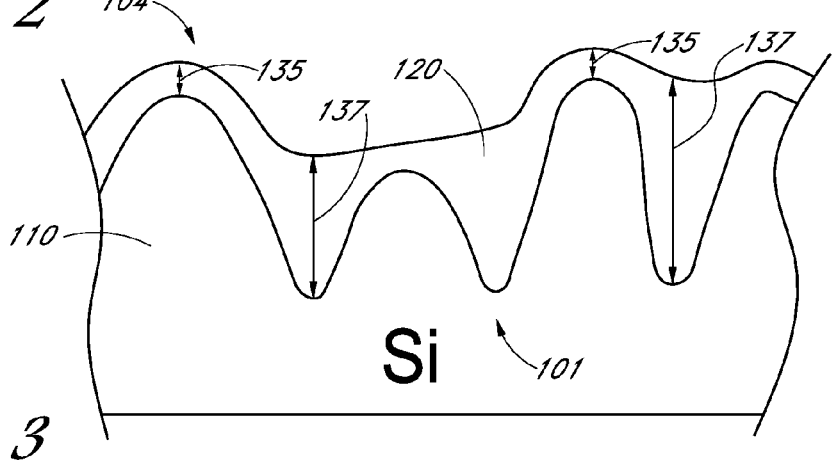

FIG. 3 illustrates the non-polished surface of FIG. 1 subsequent to the standard process for forming a first flowable matrix shown in FIG. 2. The first flowable matrix 120 can have areas of unevenly deposited line thickness 135, 137 as seen in FIG. 3 due to the variations in the heights 113, 115, as shown in FIG. 1 on the non-polished surface 101. The variation between the deposited line thicknesses 135, 137 of the first flowable matrix 120 can be significant enough to affect the final printed line quality. The consistency of the printed line width can also be affected.

Figure 4B:
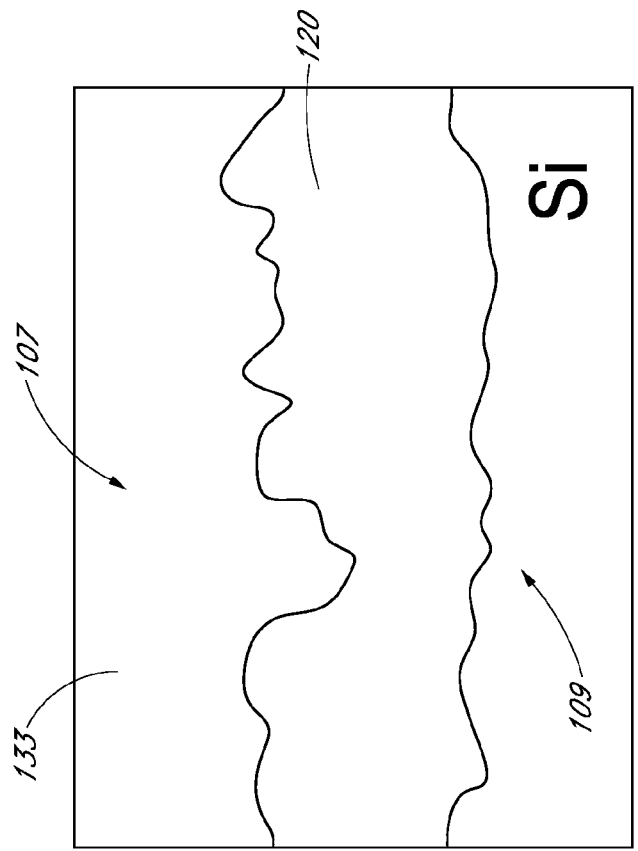
FIGS. 4A-4D are a plan view of the solar cell of FIG. 1 in accordance with a standard process for forming a first flowable matrix on a solar cell.
Figure 4A:
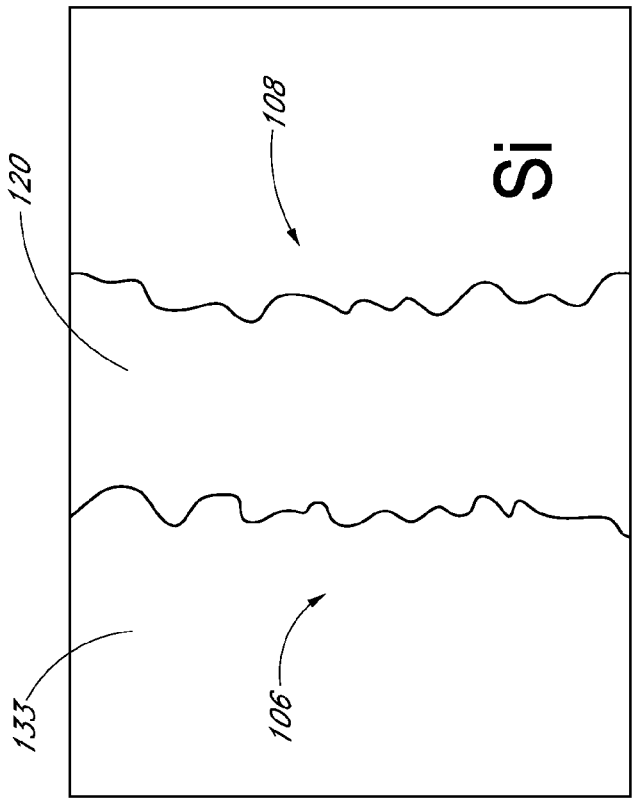
Figures 4C, 4D:
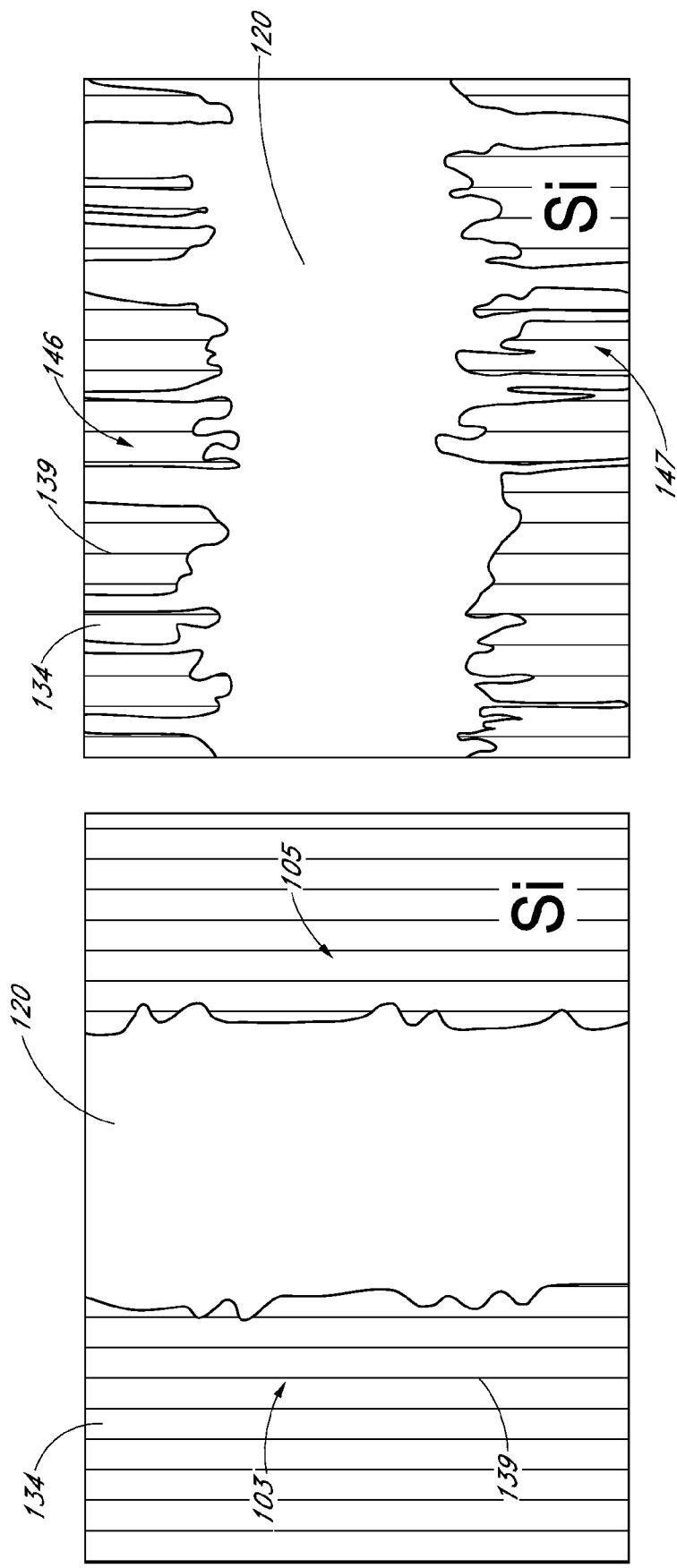

With reference to FIG. 4, there are shown examples of a plan view for vertically and horizontally printed lines formed using the method of FIG. 2. FIGS. 4(a) and (b) show the first flowable matrix printed on a non-polished surface 133 of a silicon substrate formed using a slurry wafering process. The first flowable matrix 120 can have inconsistent printed line width as seen along left and right edges 106, 108 for vertically printed lines shown in FIG. 4(a) and along the top and bottom edges 107, 109 for horizontally printed lines as shown in FIG. 4(b). The deviation or bleeding at the edges 106, 108, 107, 109 can be caused by the unevenness or roughness of the topography of the non-polished surface 133, where the first flowable matrix 120 follows the topography of the non-polished surface 133. FIGS. 4(c) and (d) show the first flowable matrix printed on a silicon substrate formed using a diamond wire wafering process. It is well known that silicon substrates formed using a diamond wire wafering process also form groove lines 139 along the non-polished surface 134 of the silicon substrate. Depending on the print orientation, the first flowable matrix 120 may flow along groove lines 139 providing inconsistent printed line width. FIG. 4(c) illustrates an example for a printed line formed along the same orientation as the grooves lines 139. In FIG. 4(c), the printed line width for vertically printed lines as seen along the left and right edges 103, 105 is similar to FIG. 4(a). In contrast FIG. 4(d) shows an example for a printed line formed along the opposite orientation as the grooves lines 139. In FIG. 4(d) the printed line width for horizontally printed lines, along the top and bottom edges 146, 147 is much more inconsistent since the groove lines act as channels where the first flowable matrix 120 may flow along.

With reference to FIGS. 5-9, there are shown methods for forming a first flowable matrix on a solar cell. One or more embodiments are directed to overcoming the print limitations discussed above, including etching a silicon substrate to form a polished surface. Details and embodiments are discussed below.

Figure 5:
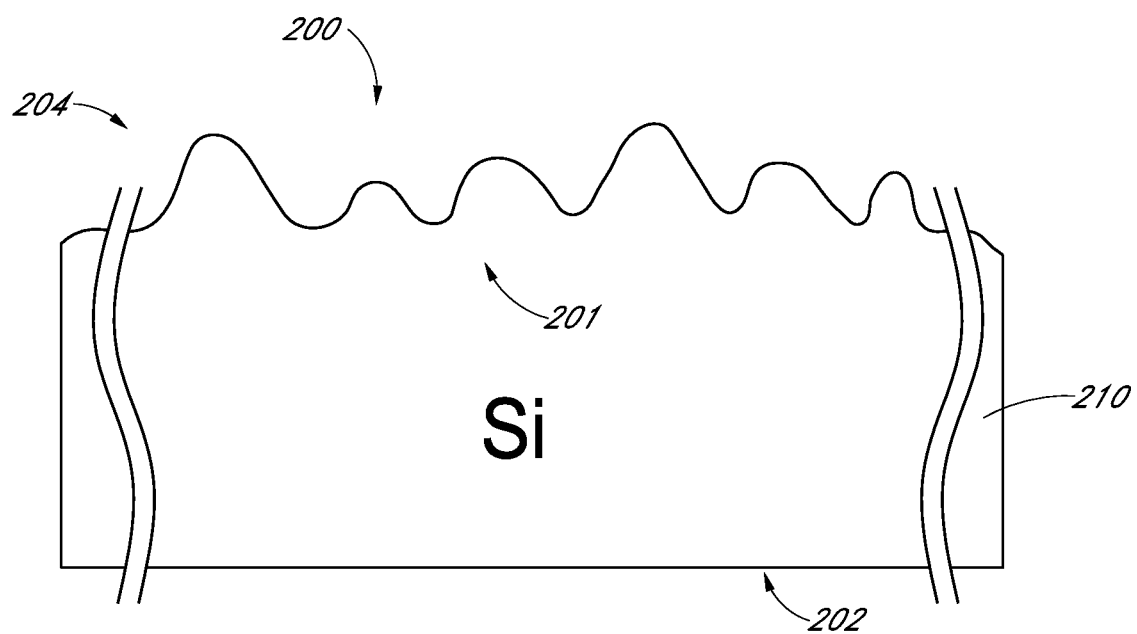
FIGS. 5-9 are cross-sectional representations of a method for forming a first flowable matrix on a solar cell.

FIG. 5 illustrates a solar cell used in conjunction with a method of forming a first flowable matrix on a solar cell. The solar cell 200, similar to the solar cell of FIG. 1, includes a front side 202 which faces the sun during normal operation and a back side 204 opposite the front side 202. The solar cell 200 also includes a silicon substrate 210, where the silicon substrate 210 includes a non-polished surface 201 on the back side 204 of the solar cell 200. In an embodiment, the method includes forming the silicon substrate 210 using a slurry wafering processes. In another embodiment, the method includes forming the silicon substrate 210 using a diamond wire wafering process. In still another embodiment, both the front and back sides 202, 204 have non-polished surfaces.

Figure 6:
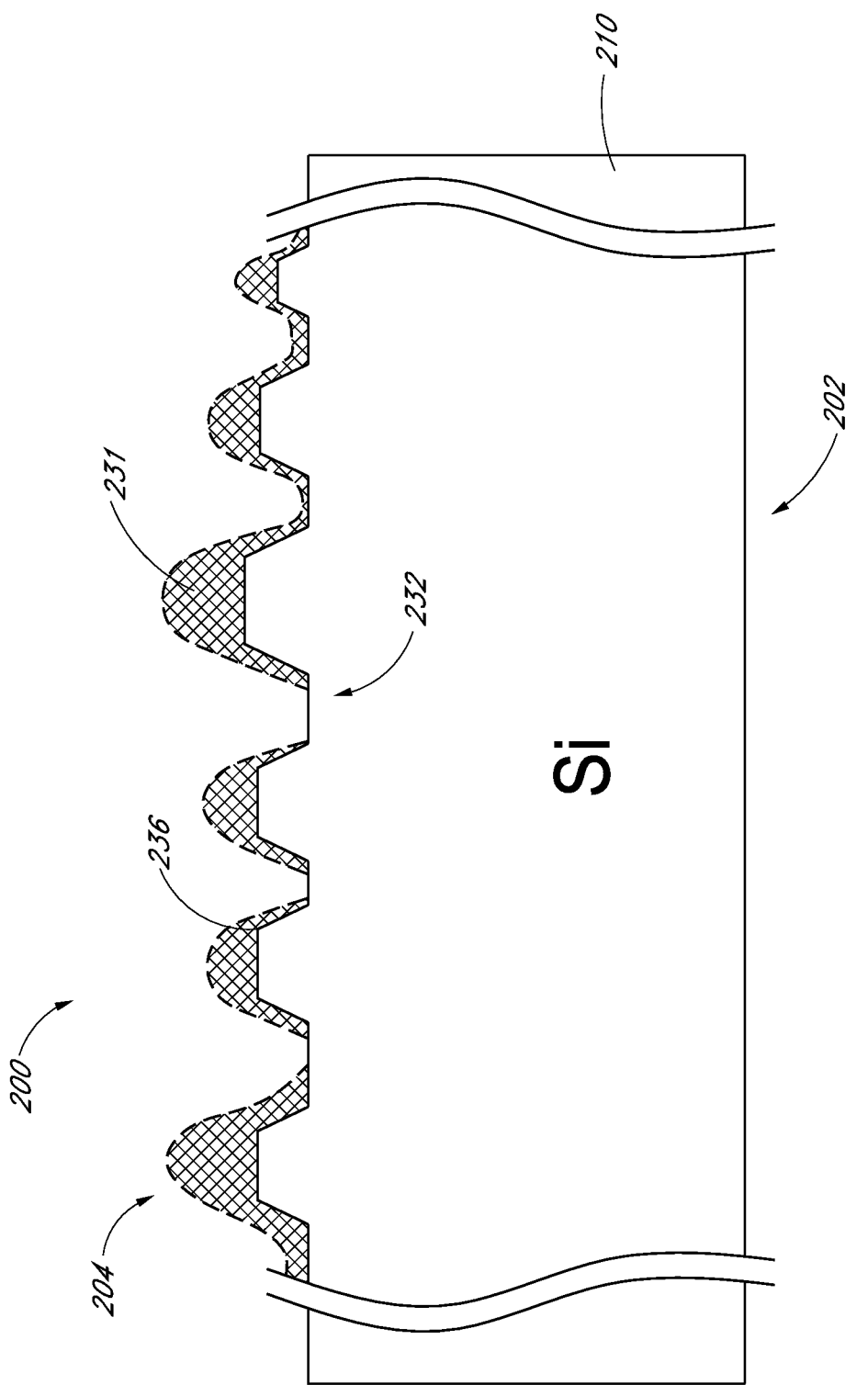

FIG. 6 illustrates a method for forming a first flowable matrix on the solar cell of FIG. 5. The method includes etching the silicon substrate 210 using an anisotropic etching process removing excess silicon 231 to form a smoothened surface 232, where forming the smoothened surface 232 includes forming sharp corners 236 along surface features of the smoothened surface 232. In an embodiment, the method includes etching with Potassium Hydroxide (KOH). In another embodiment, the method includes forming smoothened surfaces on both the front and back sides 202, 204 of the solar cell 200.

Figure 7:
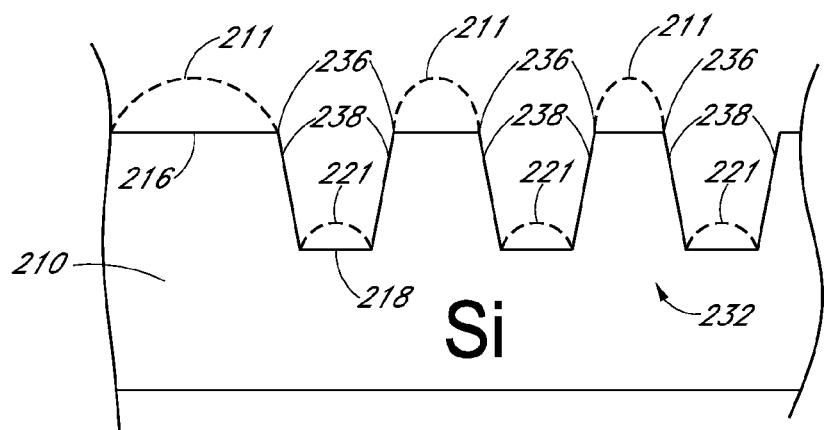

With reference to FIG. 7, there is shown the smoothened surface of FIG. 6. A general drawback to the smoothened surface 232 formed by the anisotropic etching is the possible accumulation of deposited substances 211, 221, such as the first flowable matrix, due to the sharp corners 236 along elevated and lowered regions 216, 218 of the smoothened surface 232. The possible accumulation 211, 221 can leave exposed regions 238 along side walls. The exposed regions 238 can become discontinuities within printed lines and can lead to other defects such as sites for recombination and current loss.

Figure 8:
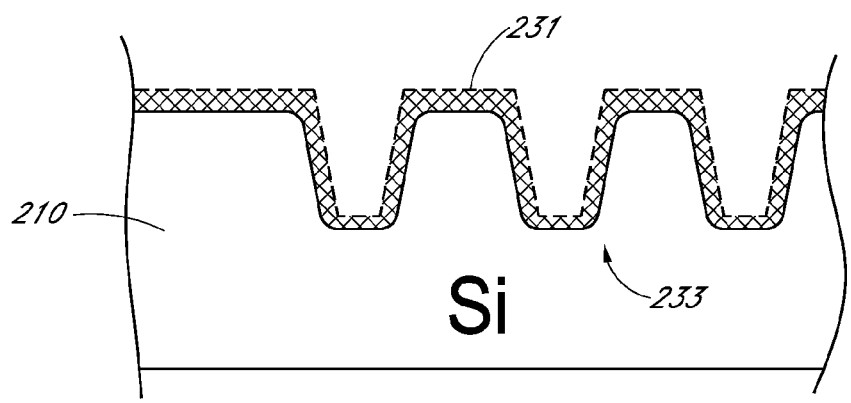

FIG. 8 illustrates the continued method for forming a first flowable matrix on the solar cell of FIG. 7. The method includes performing an isotropic etching process on the smoothened surface to remove excess silicon 231 and form a polished surface 233 of FIG. 8. In an embodiment, the etching process can include a chemical etchant such as, but not limited to, sulfuric acid ($H_2SO_4$), acetic acid ($CH_3COOH$), nitric acid ($HNO_3$), hydrofluoric acid (HF) or phosphoric acid ($H_3PO_4$). In another embodiment, the polished surface 233 is instead a semi-polished surface. In still another embodiment, a semi-polished surface is a surface of the silicon substrate with at least 8 microns etched away from the silicon substrate 210. In yet another embodiment, the polished surface 233 has at most an average of 500 nanometer peak-to-valley roughness. In an embodiment, the etchants discussed above are mixed with deionized (DI) water. In another embodiment, the method includes forming polished surfaces on both the front and back sides 202, 204. In still another embodiment, isotropically etching the smoothened surface 232 removes the sharp edges 236 of FIG. 7 formed during anisotropic etching, allowing a first flowable matrix 220 to flow freely covering the exposed regions 238 along side walls as shown in FIG. 9.

Figure 9:
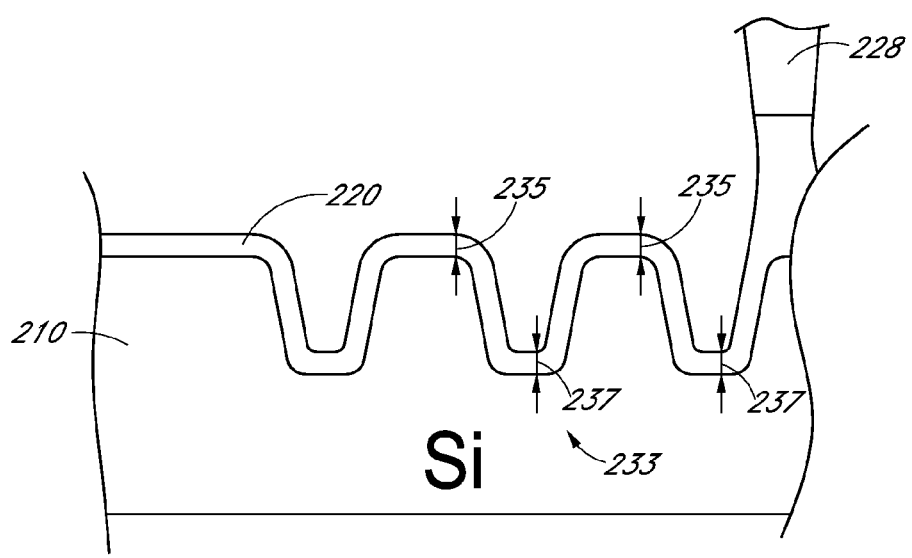

With reference to FIG. 9, there is shown the continued method of forming a first flowable matrix on the solar cell of FIG. 8. The polished surface 233 allows the first flowable matrix 220 to form uniform deposited line thickness 235, 237 as compared to the unevenly deposited line thicknesses 135, 137 as shown in FIG. 3. In an embodiment, the first flowable matrix 220 is deposited using industrial printing method such as an ink-jet printing, where ink-jet printing includes an ink-jet printer having a dispensing mechanism with a nozzle 228 to deposit the first flowable matrix 220. In another embodiment, the first flowable matrix 220 is a first dopant material having a first dopant source. In still another embodiment, the first flowable matrix 220 includes a material having a viscosity in the range of 1-25 centipoise (cP). In yet another embodiment, the method includes providing a first flowable matrix 220 including a material such as, but not limited to, an etch resist ink, a flowable amorphous silicon or a flowable polysilicon. In an embodiment, the method includes forming the first flowable matrix 220 over the polished surface 233 on the back side 204 of the solar cell 200 using a method such as, but not limited to, screen printing or spin coating.

Figure 10:
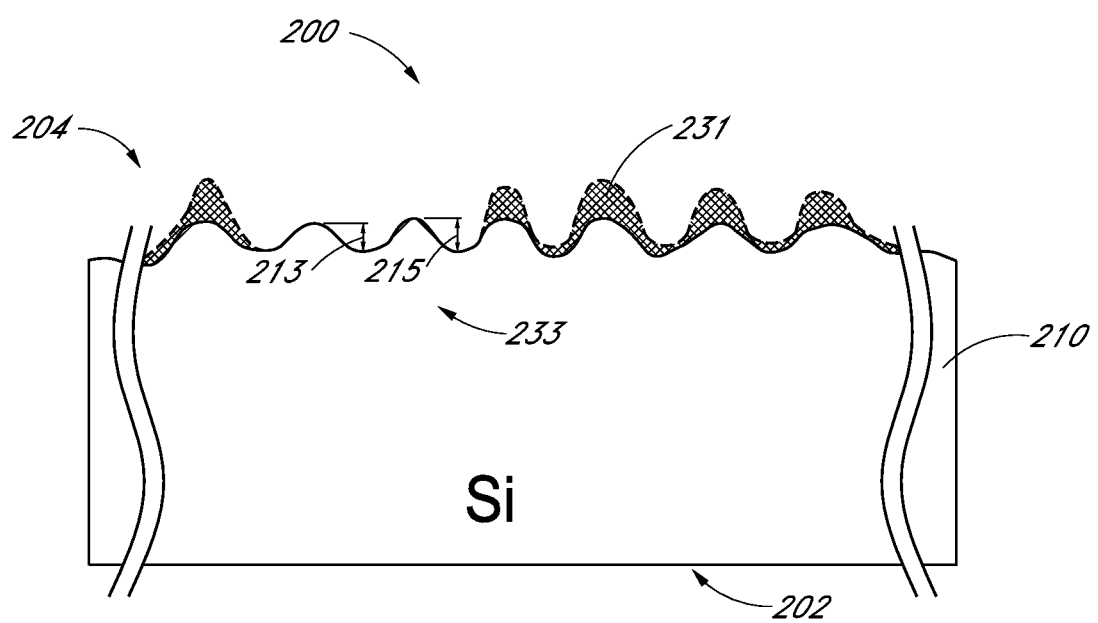
FIGS. 10-12 are cross-sectional representations of another method for forming a first flowable matrix on a solar cell.
Figure 11:
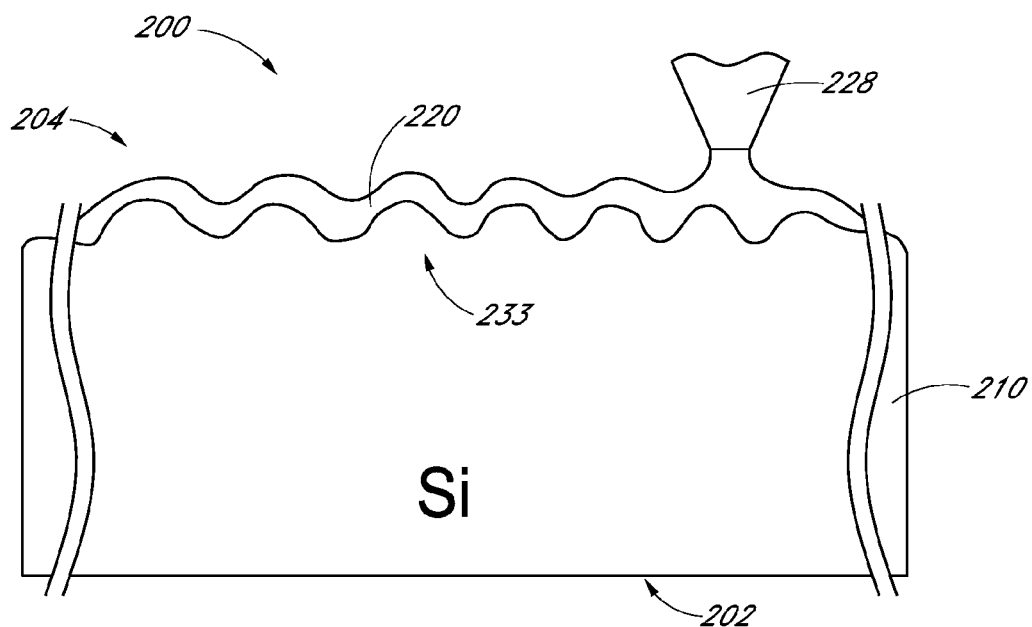
Figure 12:
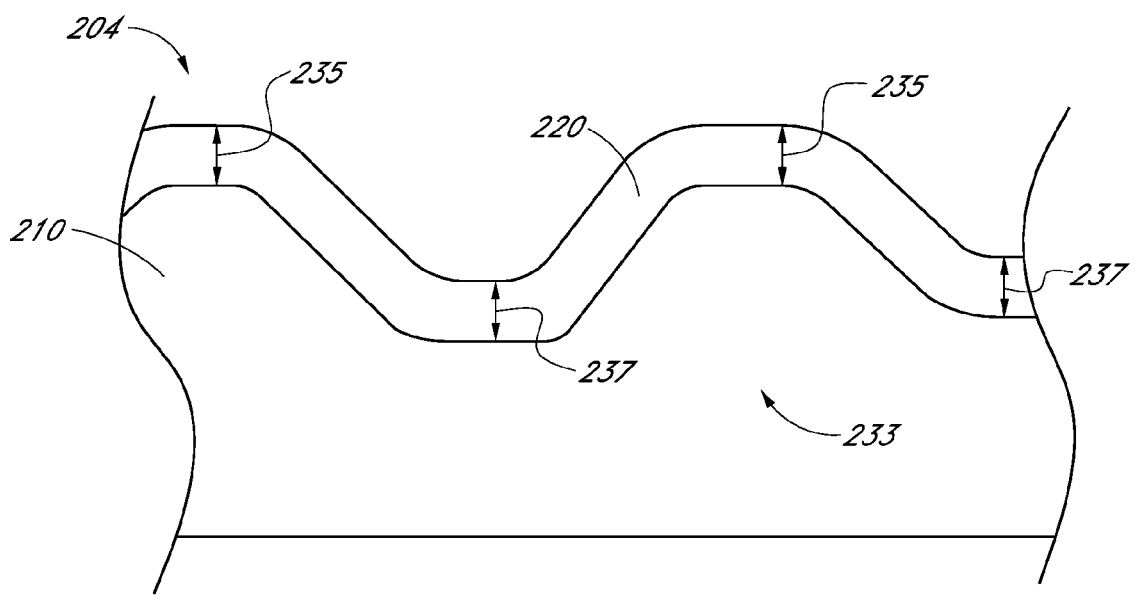

With reference to FIGS. 10-12, there are shown another method for forming a first flowable matrix on a solar cell. Details and embodiments are discussed below.

With reference to FIG. 10, there is shown a method for forming a first flowable matrix on the solar cell of FIG. 5. The method includes isotropically etching the non-polished surface 201 of FIG. 5 and removing excess silicon 231 on the silicon substrate 210 to form a polished surface 233 as shown in FIG. 10. This method is in contrast to the method shown in FIGS. 6-9, where a smoothened surface is first formed prior to forming a polished surface on the silicon substrate 210. The method for polishing includes using an acid etching process to form the polished surface 233, including a chemical etchant such as, but not limited to, sulfuric acid ($H_2SO_4$), acetic acid ($CH_3COOH$), nitric acid ($HNO_3$), hydrofluoric acid (HF) or phosphoric acid ($H_3PO_4$). In an embodiment, the etchant is an isotropic etchant. In another embodiment, the method includes forming polished surfaces on both the front and back side 202, 204 of the solar cell 200. In still another embodiment, polishing the back side 204 provides an increase in solar cell efficiency in the range of 0.02-0.1 percent due to unabsorbed light reflected of the backside of the solar cell. In yet another embodiment, the polished surface 233 includes surface features, where the surface features have heights 213, 215 measured by a peak-to-valley distance similar to that shown in FIG. 1. In an embodiment, the surface feature heights 213, 215 have at most 500 nanometer peak-to-valley height. In another embodiment, the polished surface 233 has at most an average of 500 nanometer peak-to-valley roughness. In still another embodiment, the polished surface 233 is a semi-polished surface. In yet another embodiment, a semi-polished surface is a surface of the silicon substrate 210 with at least 8 microns etched away from the silicon substrate 210. In an embodiment, the etchants discussed above are mixed with deionized (DI) water. In still another embodiment, a chemical-mechanical polishing technique is used to etch the silicon substrate 210.

FIG. 11 illustrates the continued method of forming a first flowable matrix on the solar cell of FIG. 10. In an embodiment, the first flowable matrix 220 is deposited using industrial printing methods such as an ink-jet printing, where ink-jet printing includes an ink-jet printer having a dispensing mechanism with a nozzle 228 to deposit the first flowable matrix 220. In another embodiment, the first flowable matrix 220 is a first dopant material having a first dopant source. In still another embodiment, the first flowable matrix 220 includes a material having a viscosity in the range of 1-25 centipoise (cP). In yet another embodiment, the method includes providing a first flowable matrix 220 including a material such as, but not limited to, an etch resist ink, a flowable amorphous silicon or a flowable polysilicon. In an embodiment, the method includes forming the first flowable matrix 220 over the polished surface 233 on the back side 204 of the solar cell 200 using a method such as, but not limited to screen printing or spin coating.

With reference to FIG. 12, there is shown the polished surface of FIG. 11. Similar to the above, the polished surface 233 allows the first flowable matrix 220 to form uniform deposited line thickness 235, 237 as compared to the unevenly deposited lined thicknesses 135, 137 shown in FIG. 3. The consistency of the printed line width is also improved as seen in FIG. 13.

FIG. 13 illustrates examples of a plan view for vertically and horizontally printed lines on the polished surfaces of FIG. 9 and FIG. 12. FIGS. 13(a) and (b) show the first flowable matrix 220 printed on the polished surface 233 of a silicon substrate, where the silicon substrate was formed using a slurry wafering process. The first flowable matrix 220 shows a marked improvement in printed line width from FIGS. 4(a) and (b) with no deviations along left and right edges 206, 208 for vertically printed lines as seen in FIG. 13(a) and along the top and bottom edges 207, 209 for horizontally printed lines as seen in FIG. 13(b). FIGS. 13(c) and (d) show the first flowable matrix 220 printed on the polished surface 234 of a silicon substrate, where the silicon substrate is formed using a diamond wire wafering process. As discussed above and shown in FIGS. 4(c) and (d), diamond wire wafering processes produce groove lines on silicon substrates, where FIG. 4 shows that a first flowable matrix can flow along groove lines providing inconsistent printed lined width. FIGS. 13(c) and (d) show that even with groove lines 239, the polished surface 234 allows the first flowable matrix 220 to have a marked improvement in printed line width as compared from FIGS. 4(c) and (d). The improvement is seen in both FIGS. 13(c) and (d), where there are no deviations along left and right edges 203, 205 for vertically printed lines as seen in FIG. 13(c) and along the top and bottom edges 246, 247 for horizontally printed lines as seen in FIG. 13(d).

With reference to FIGS. 14-25, a method fabricating a solar cell is presented. Details and embodiments of the method are discussed below.

Figure 14:
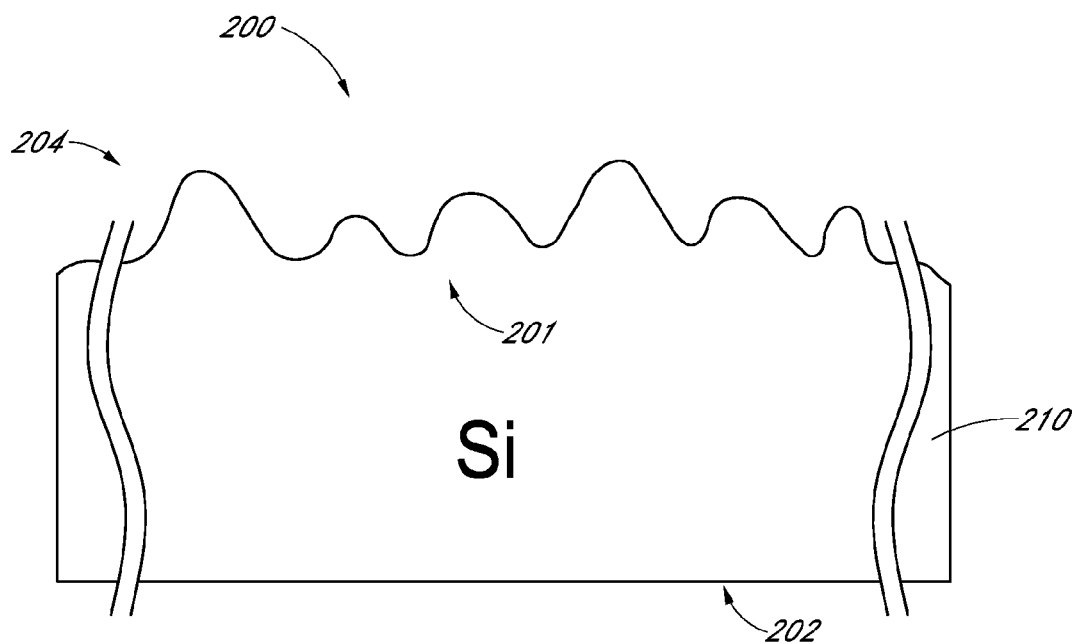
FIGS. 14-25 are cross-sectional representations of a solar cell being fabricated in accordance with the methods for forming a first flowable matrix on a solar cell of FIGS. 5-13.

FIG. 14 illustrates a solar cell used in conjunction with a method for fabricating a solar cell. The solar cell 200, similar to the solar cell of FIG. 5, includes a front side 202 configured to face the sun during normal operation and a back side 204 opposite the front side 202. The solar cell 200 also includes a silicon substrate 210, where the silicon substrate 210 includes a non-polished surface 201 on the back side 204 of the solar cell 200. In an embodiment, the method includes forming the silicon substrate 210 using a slurry wafering processes. In another embodiment, the method includes forming the silicon substrate 210 using a diamond wire wafering process.

Figure 15:
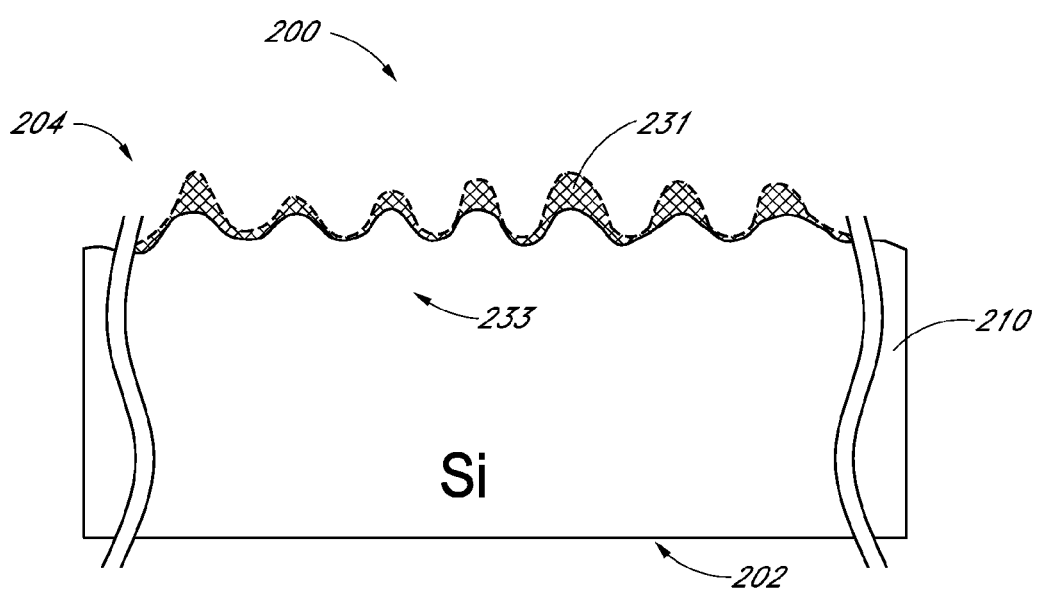

With reference to FIG. 15, there is shown a method for fabricating a solar cell. The method includes etching the silicon substrate of the solar cell of FIG. 14, where any of the processes described from FIGS. 6-13 can be used to remove excess silicon 231 and form a polished surface 233. In an embodiment, the method includes forming polished surfaces on both the front and back sides 202, 204 of the solar cell 200.

Figure 16:
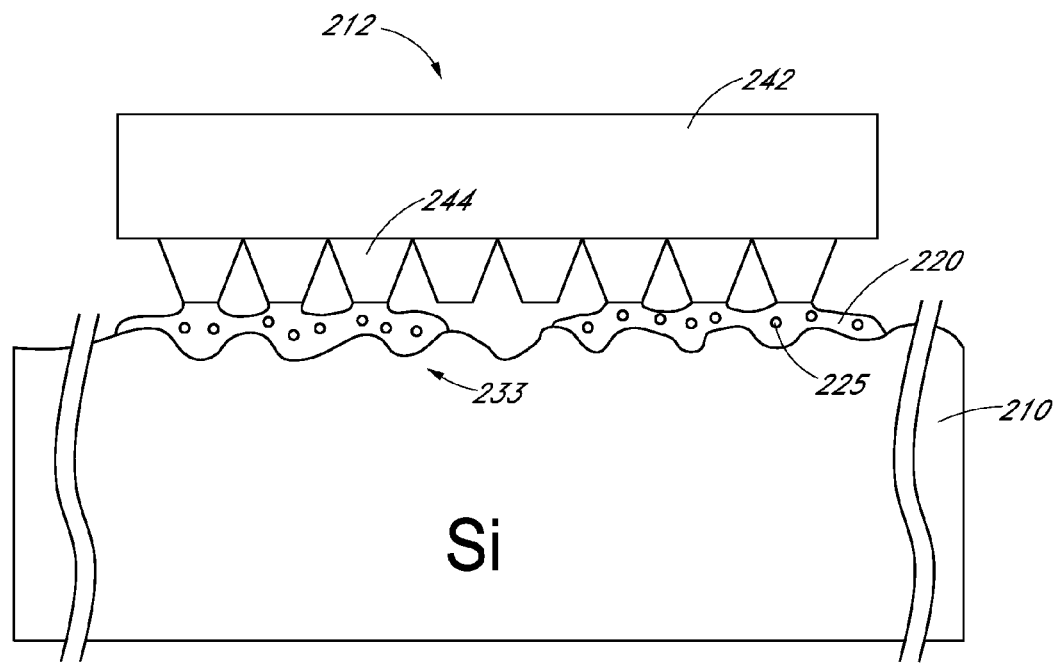
Figure 17:
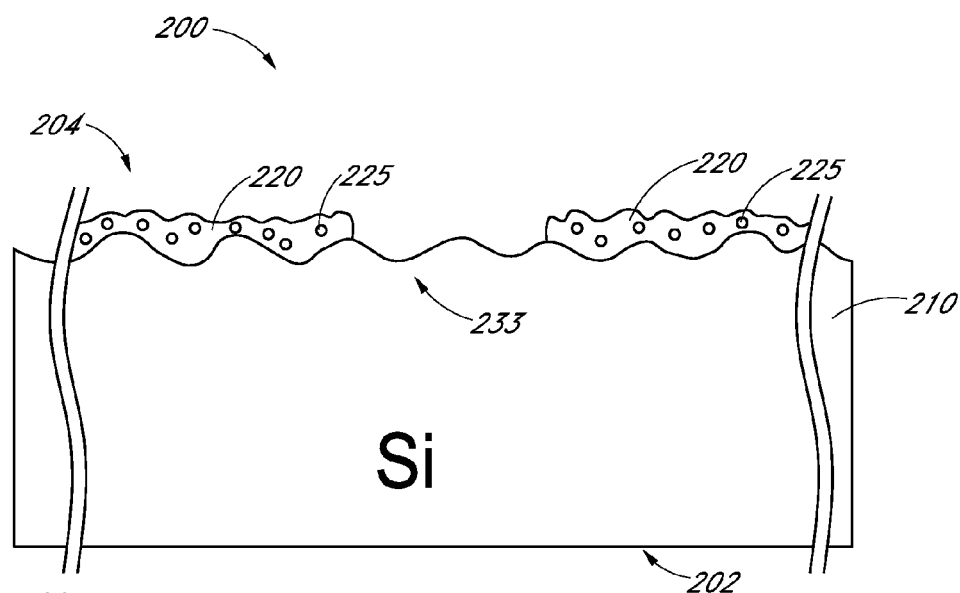

FIGS. 16 and 17 illustrate the continued method for fabricating a solar cell. The method includes forming a first flowable matrix on the polished surface 233 of the solar cell of FIG. 15. In an embodiment, the first flowable matrix is a first dopant material 220, where the first dopant material 220 includes a first dopant source 225. In another embodiment, the first dopant source 225 includes a doping material but is not limited to a positive-type dopant such as boron or a negative-type dopant such as phosphorous. In yet another embodiment, the first dopant material 220 has a viscosity in the range of 1-25 centipoise (cP). The method also includes depositing the first dopant material 220 over the polished surface 233 using industrial printing methods such as an ink-jet printing, where the polished surface 233 allows the first dopant material 220 to form uniform deposited line thickness and consistently or evenly printed line widths. In another embodiment, ink-jet printing includes an ink-jet printer 212 having a printhead 242 and plurality of nozzles 244. In still another embodiment, the method includes forming the first dopant material 220 using a technique such as, but not limited to screen printing or spin coating. FIG. 17 shows the solar cell 200 subsequent to forming the first dopant material 220.

Figure 18:
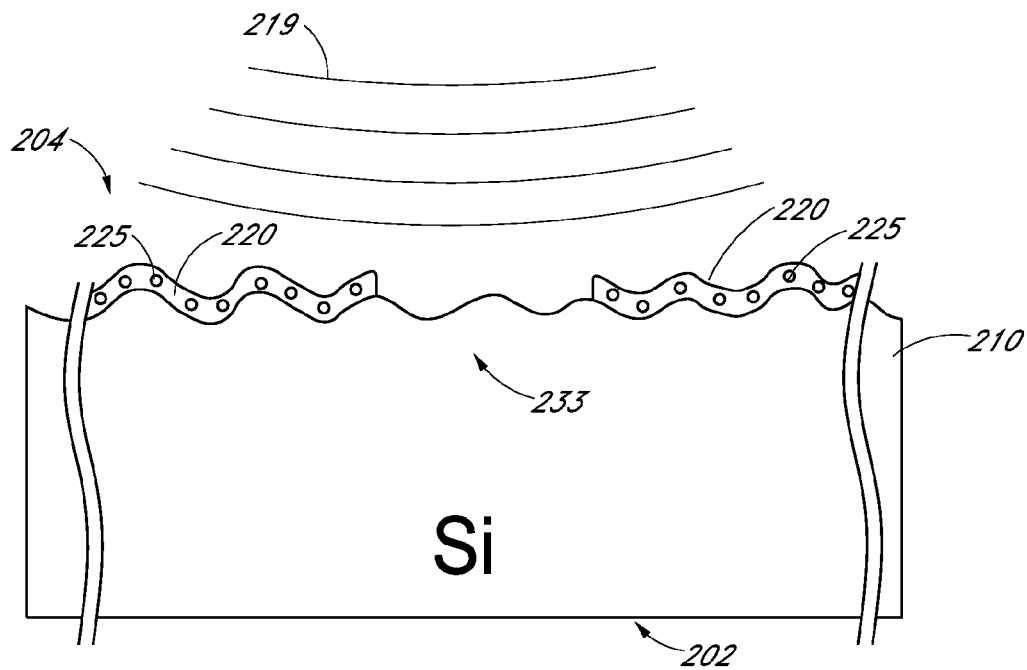

With reference to FIG. 18, there is shown the continued method for fabricating a solar cell. The method includes curing 219 the first dopant material 220. In an embodiment, the method includes curing the first dopant material 220 using any curing technique such as thermal curing, photo-curing or exposure ultraviolet (UV) light.

Figure 19:
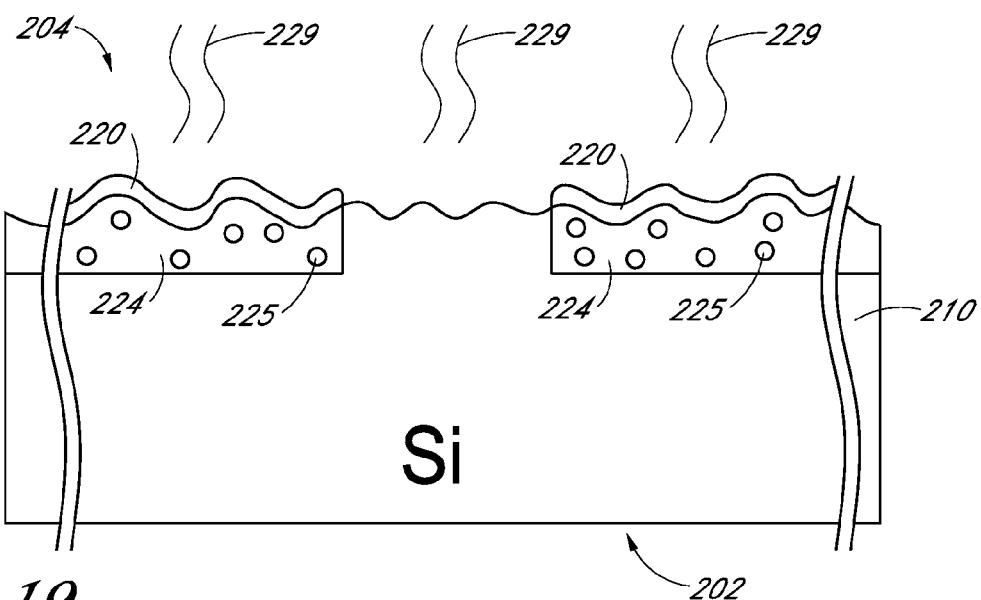

FIG. 19 illustrates the continued method for fabricating a solar cell. The method includes heating 229 the silicon substrate 210 and the first dopant material 220 to a temperature sufficient to cause the first dopant source 225 to diffuse into the silicon substrate 210, forming a first doped region 224.

Figure 20:
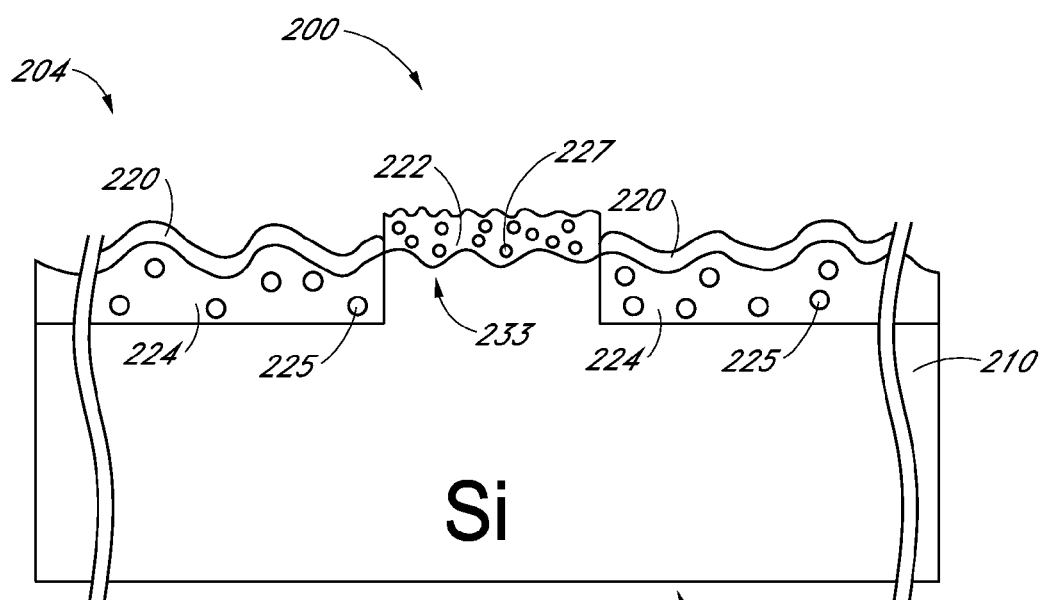

With reference to FIG. 20, there is shown the continued method for fabricating a solar cell. The method includes forming a second flowable matrix on the polished surface 233 of the solar cell of FIG. 19. In an embodiment, the second flowable matrix is a second dopant material 222 including a second dopant source 227. In another embodiment, the second dopant source 227 includes a doping material but is not limited a negative-type dopant such as phosphorous or a positive-type dopant such as boron. In still another embodiment, the second dopant material 222 has a viscosity in the range of 1-25 centipoise (cP). The method also includes depositing the second dopant material 222 over the polished surface 233 using industrial printing methods such as an ink-jet printing, where the polished surface 233 allows the second dopant material 222 to form uniform deposited line thickness and consistently or evenly printed line widths. In yet another embodiment, the method includes forming the second dopant material 222 using any of the techniques described above.

Figure 21:
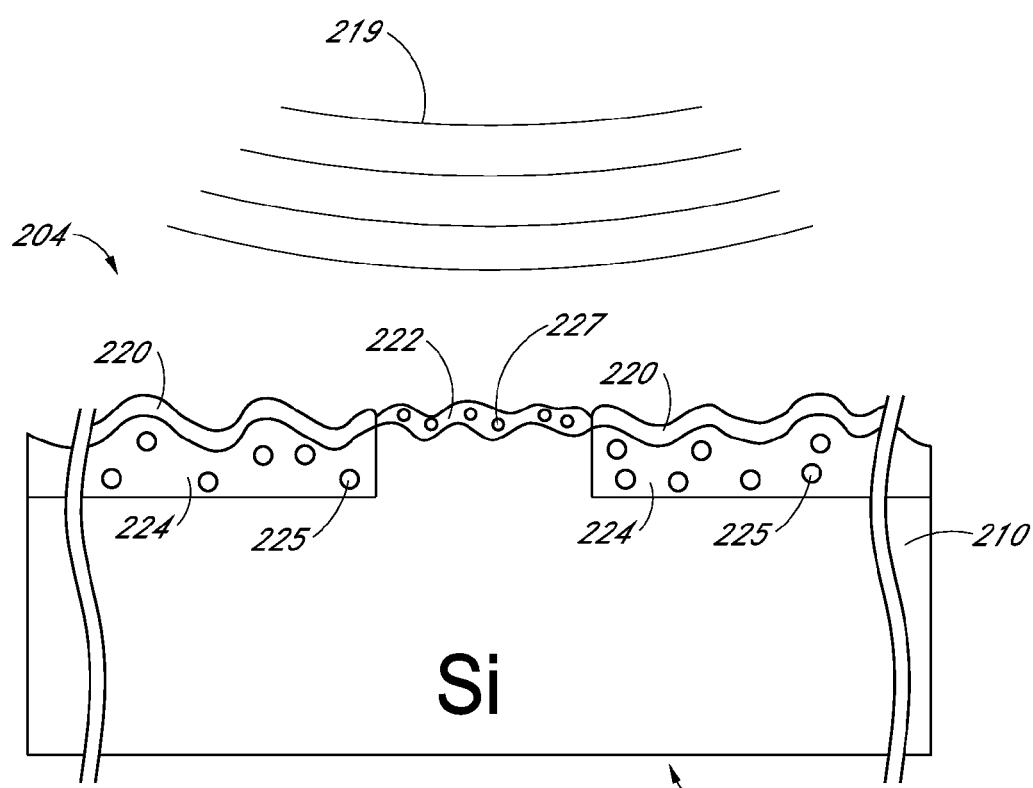

With reference to FIG. 21, there is shown the continued method for fabricating a solar cell. The method includes curing 219 the second dopant material 222. In an embodiment, the method includes curing the second dopant material 222 using any curing technique such as thermal curing, photo-curing or exposure ultraviolet (UV) light.

Figure 22:
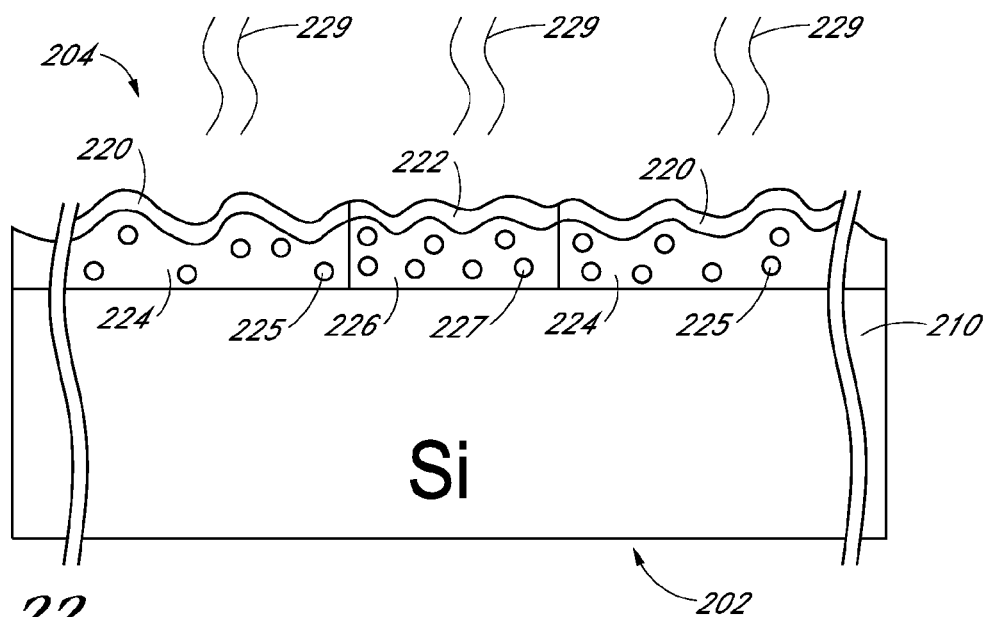

FIG. 22 illustrates the continued method for fabricating a solar cell. The method includes heating 229 the silicon substrate 210 and the second dopant material 222 to a temperature sufficient to cause the second dopant source 227 to diffuse into the silicon substrate 210, forming a second doped region 226. In an embodiment, the first and second doped regions 224, 226 each include a dopant source 226, 227 such as, but not limited to a positive-type dopant such as boron or a negative-type dopant such as phosphorous. In another embodiment, the first and second doped regions 224, 226 are instead first and second doped polysilicon regions deposited over the silicon substrate 210, where a trench region separates the first and second doped polysilicon regions. In still another embodiment, the trench region is texturized. In yet another embodiment, the method includes providing a dielectric layer between the first and second doped polysilicon regions and the silicon substrate 210. In an embodiment, the dielectric layer is an oxide layer. In another embodiment, the first and second doped polysilicon regions each include a doping material such as, but not limited to, a positive-type dopant such as boron or a negative-type dopant such as phosphorous.

Figure 23:
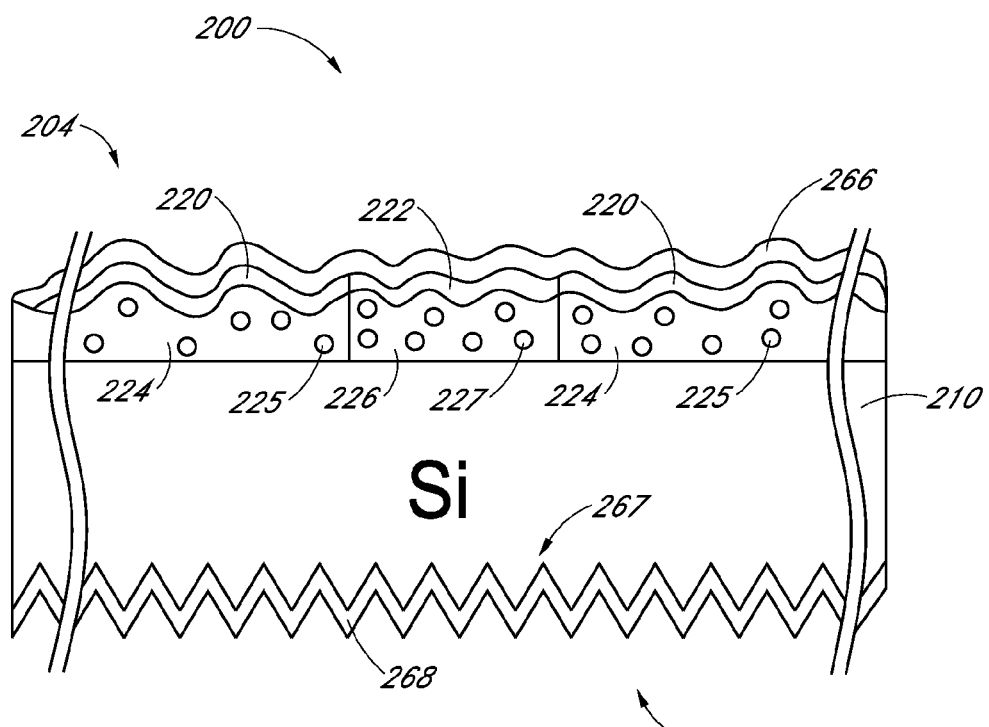

With reference to FIG. 23, there is shown the continued method for fabricating a solar cell. The method includes forming a texturized region 267 on the front side 202 of the solar cell 200. The texturized region 267 can be one which has a regular or an irregular shaped surface. The method also includes forming an anti-reflective coating (ARC) 268 over the texturized region 267 on the front side 202 to further improve the light absorption properties of the solar cell 200. The method includes forming an anti-reflective coating (BARC) 266 on the back side 204 of the solar cell 200. In an embodiment, the BARC 266 is a first dielectric layer and the ARC 268 is a second dielectric layer. In another embodiment, both the ARC 268 and BARC 266 layers are composed of silicon nitride (SiN) or any other material that is commonly used for anti-reflective coating of a solar cell. In still another embodiment, the texturized region 267 is formed using a standard etching process.

Figure 24:
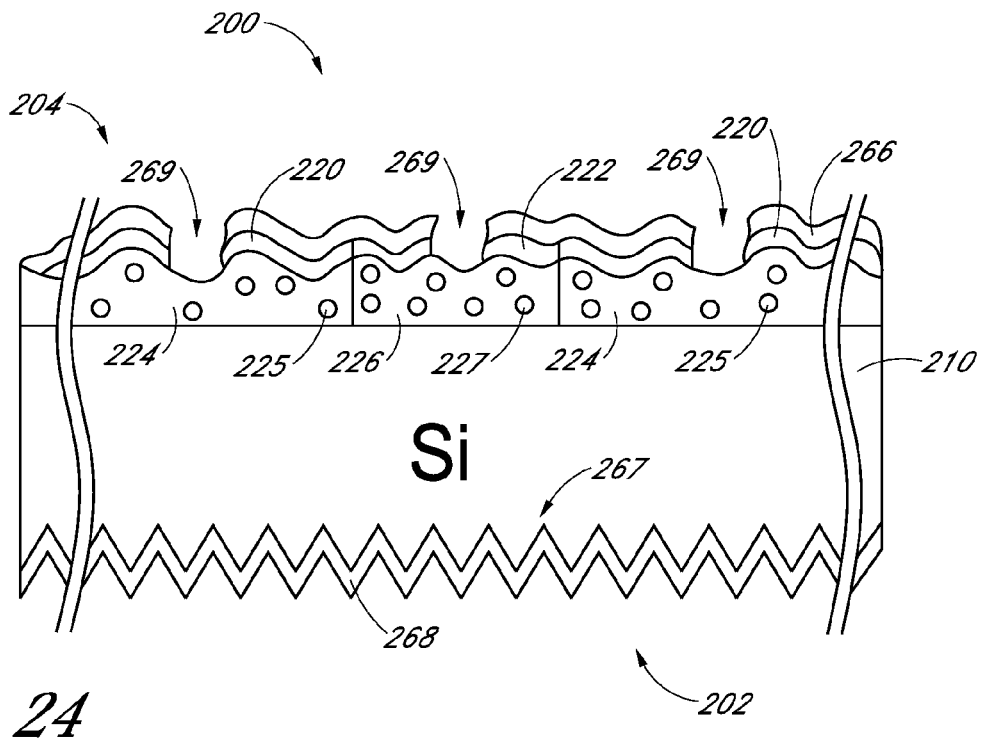

FIG. 24 illustrates the continued method for fabricating a solar cell. The method includes forming contact openings 269 through the BARC 266 and the first and second dopant material 220, 222 using any lithographic processes, including but not limited to wet chemical etching and laser ablation. In an embodiment, the contact openings include a plurality of contact openings. In another embodiment, the BARC 266 is a first dielectric layer.

Figure 25:
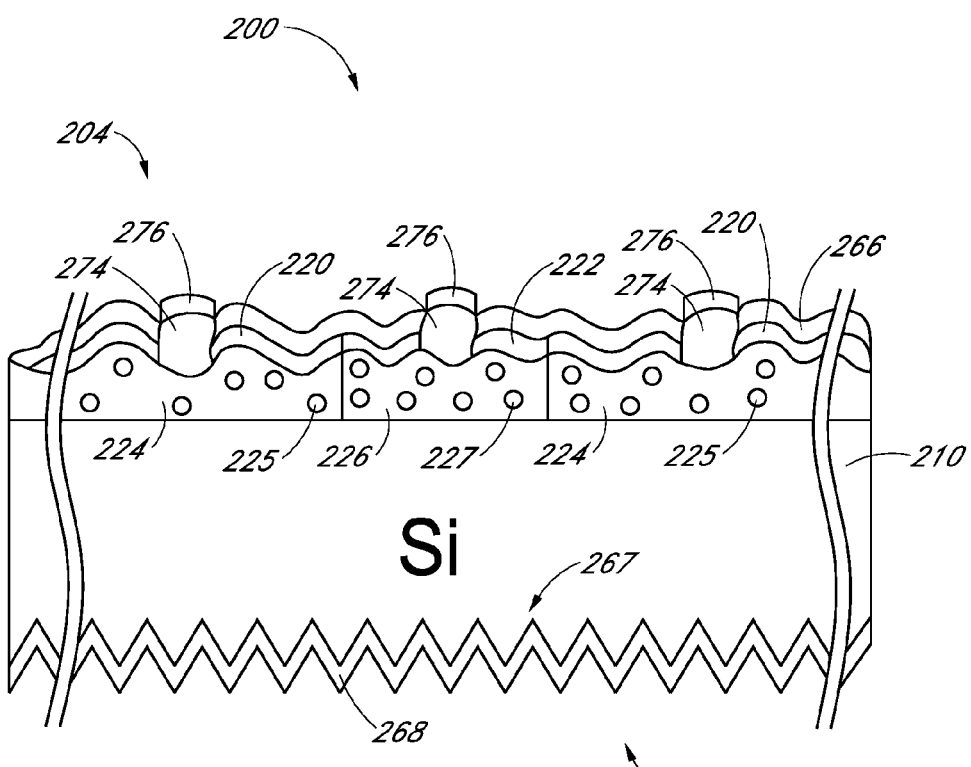

With reference to FIG. 25, there is shown the continued method for fabricating a solar cell. The method includes depositing a first metal paste 274 to at least fill one contact opening 269 from FIG. 24 established through the BARC 266 or a first dielectric layer formed over the first and second doped regions 224, 226, where the topography of the first and second doped regions 224, 226 is conformal with the polished surface 233, from FIGS. 15-18, of the silicon substrate 210. The method also includes depositing a second metal paste 276 to connect more than one contact opening filled with the first metal paste 274 to form interdigitated patterns over the BARC 266 or first dielectric layer on the back side 204. In an embodiment, the first and second metal paste 274, 276 are deposited by industrial printing methods over the polished surface 233. In another embodiment, the second metal paste 276 is conformal with the polished surface 233, from FIGS. 15-18, of the silicon substrate 210. In still another embodiment, the first and second metal paste 274, 276 are deposited through a screen printing process. In yet another embodiment, the first and second metal paste includes an aluminum paste. The method includes curing the first and second metal paste 274, 276 to form a first metal layer. In an embodiment, the first metal layer includes electrically connected grids to the first and second doped regions 224, 226 underneath the BARC 266 or first dielectric layer on the back side 204. In yet another embodiment, the first metal layer is composed of a layer of aluminum. In an embodiment, the curing process is a heating process. In another embodiment, the first metal layer can instead be formed through a standard physical vapor deposition process, such as sputtering, and a subsequent annealing process. The method also includes plating a first and subsequently a second metal on the first metal layer to form a second metal layer over the first metal layer. In an embodiment, the second metal layer is formed on the first metal layer using a conventional plating process. In an embodiment, the first metal layer electrically couples the second metal layer to the first and second doped regions 224, 226. In still another embodiment, plating a first and second metal includes plating a metal such as, but not limited to, copper, tin, aluminum, silver, gold, chromium, iron, nickel, zinc, ruthenium, palladium, or platinum. In still another embodiment, the methods described above are used for different types of solar cells such as, but not limited to, a back-contact solar cell, a front-contact solar cell, a monocrystalline silicon solar cell, a polycrystalline silicon solar cell and an amorphous silicon solar cell.

Figure 26:
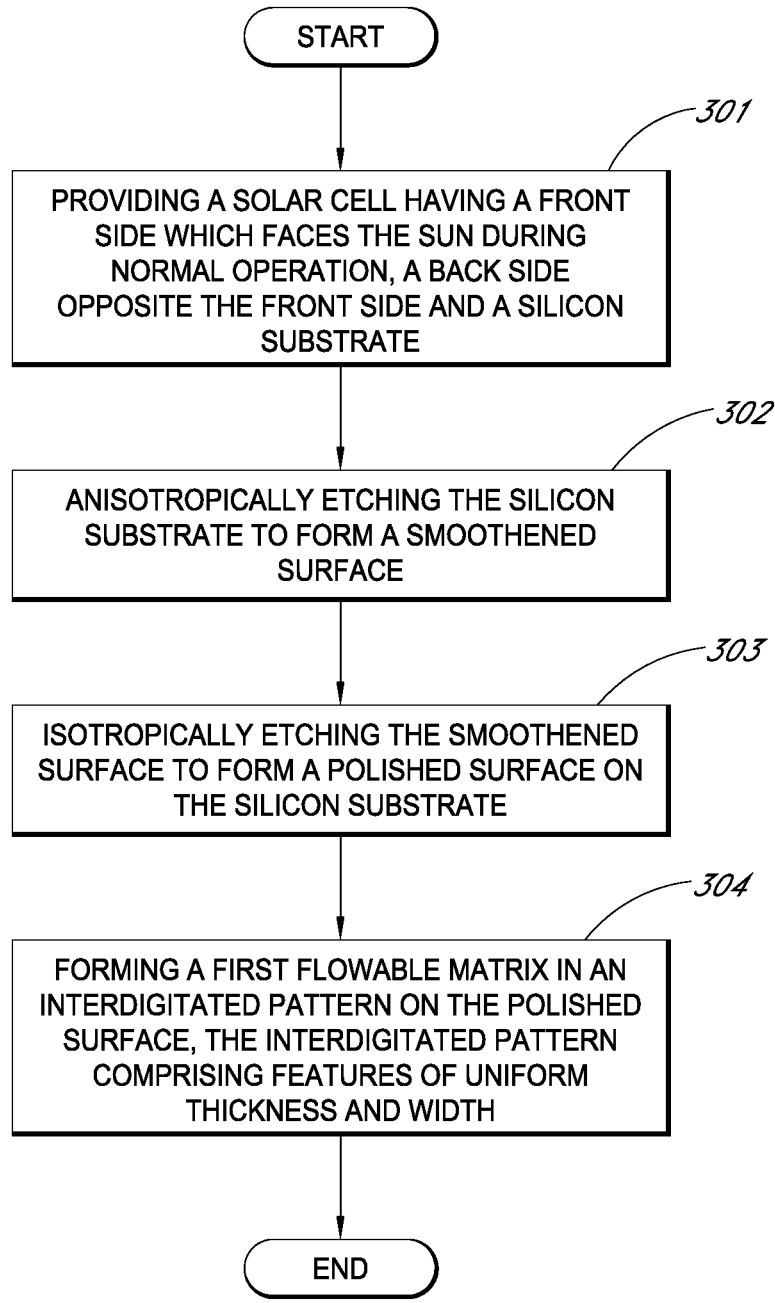
FIGS. 26 and 27 are flowchart representation of methods for forming a first flowable matrix on a solar cell.

FIG. 26 illustrates a flowchart of an embodiment for forming a first flowable matrix on the solar cell as shown in FIGS. 5-9. As discussed above, a first operation 301 can include providing a solar cell 200 having a front side 202 which faces the sun during normal operation, a back side 204 opposite the front side 202 and a silicon substrate 210. A second operation 302 can include anisotropically etching the silicon substrate 210 to form a smoothened surface 232. A third operation 303 can include isotropically etching the smoothened surface 232 to form a polished surface 233 on the silicon substrate 210. The last operation 304 can include forming a first flowable matrix 220 in an interdigitated pattern on the polished surface 233, the interdigitated pattern comprising features of uniform thickness and width.

Figure 27:
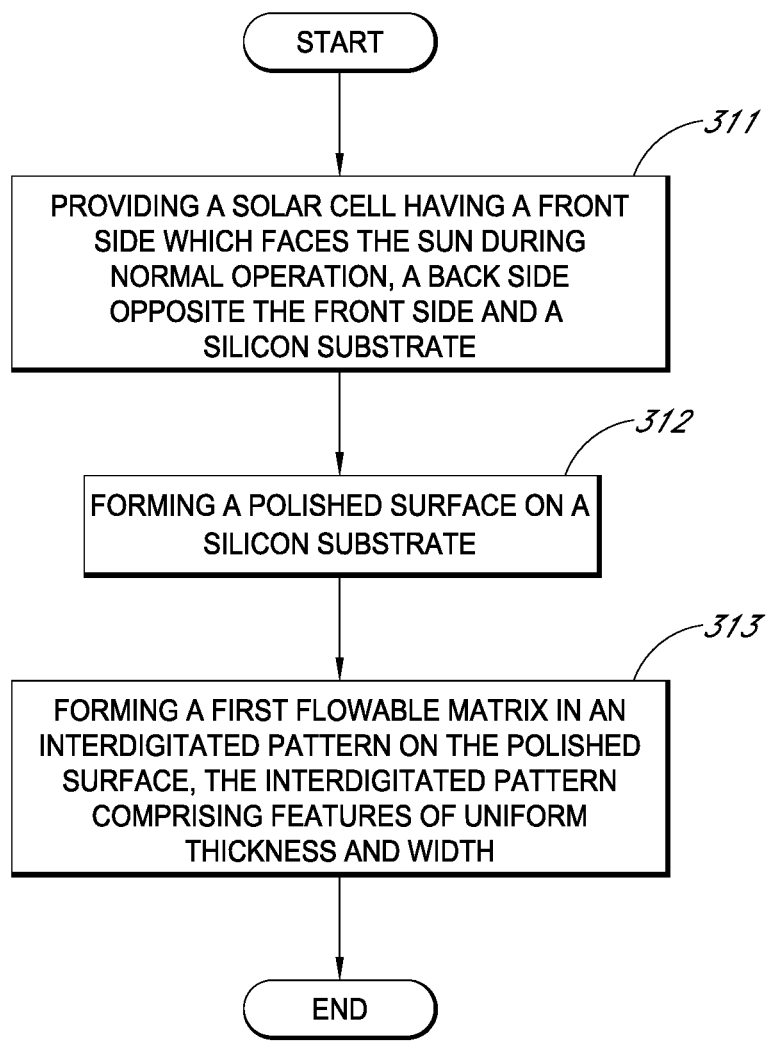

With reference to FIG. 27, a flowchart of an embodiment for forming a first flowable matrix on the solar cell of FIGS. 10-12 is shown. As discussed above, a first operation 311 can include providing a solar cell 200 having a front side 202 which faces the sun during normal operation, a back side 204 opposite the front side 202 and a silicon substrate 210. A second operation 312 can include forming a polished surface 233 on a silicon substrate 210. The last operation 313 can include forming a first flowable matrix 220 in an interdigitated pattern on the polished surface 233, the interdigitated pattern comprising features of uniform thickness and width.

Figure 28:
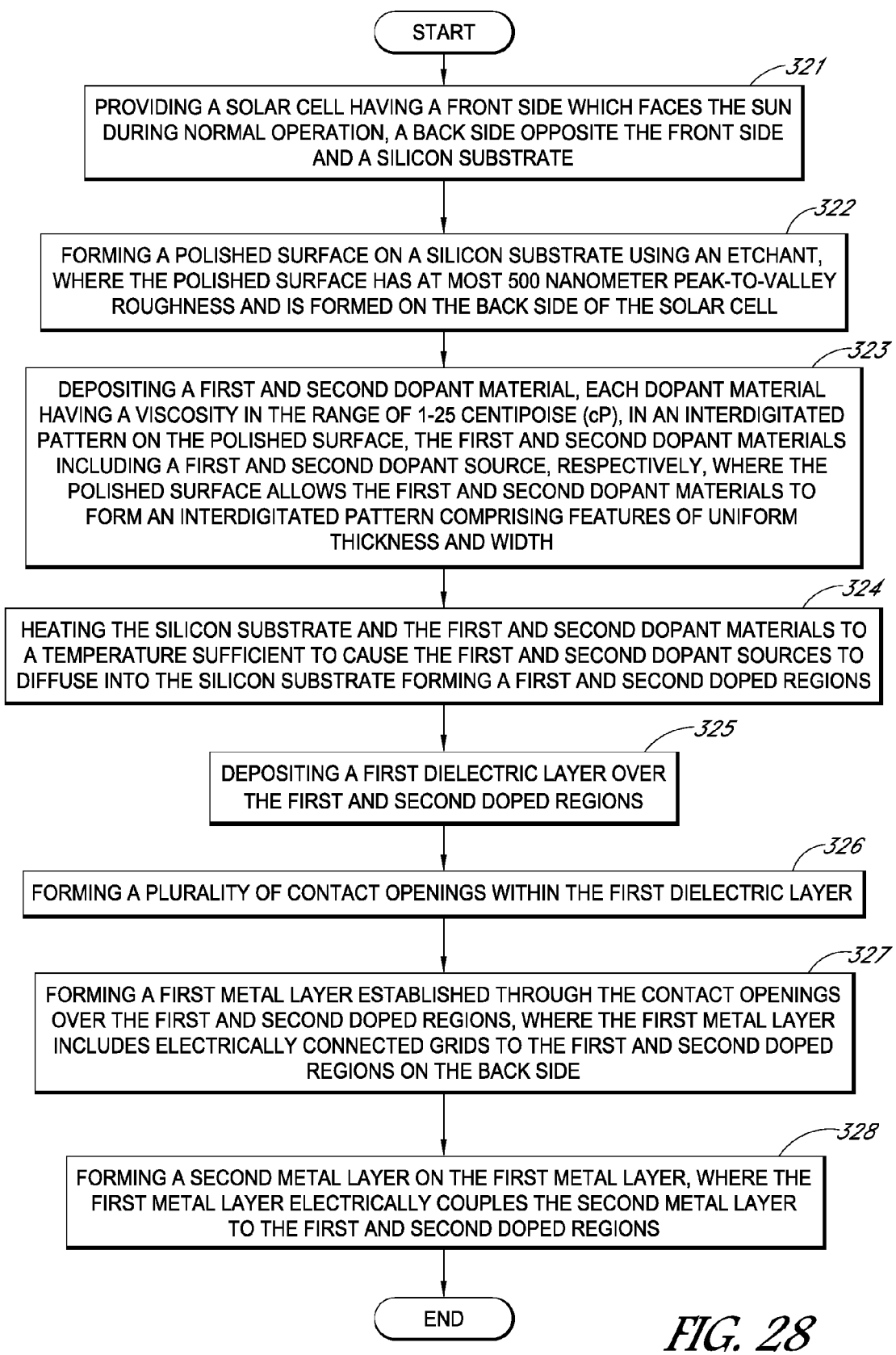
FIGS. 28 and 29 are flowchart representations of methods for fabricating a solar cell in accordance with the methods for forming a first flowable matrix on a solar cell of FIGS. 5-13.

With reference to FIG. 28, there is shown a flowchart of an embodiment for a method for fabricating a solar cell as illustrated in FIGS. 14-25. As discussed above, a first operation 321 can include providing a solar cell 200 having a front side 202 which faces the sun during normal operation, a back side 204 opposite the front side 202 and a silicon substrate 210. A second operation 322 can include forming a polished surface 233 on a silicon substrate 210 using an etchant, where the polished surface 233 has at most 500 nanometer peak-to-valley roughness and is formed on the back side 204 of the solar cell 200. A third operation 323 can include depositing first and second dopant materials 220, 222, each material having a viscosity in the range of 1-25 centipoise (cP), in an interdigitated pattern on the polished surface 233, the first and second dopant materials 220, 222 including a first and second dopant source 225, 227, respectively, where the polished surface 233 allows the first and second dopant materials 220, 222 to form an interdigitated pattern comprising features of uniform thickness and width. A fourth operation 324 can include heating the silicon substrate 210 and the first and second dopant materials 220, 222 to a temperature sufficient to cause the first and second dopant sources 225, 227 to diffuse into the silicon substrate 210. A fifth operation 325 can include depositing a first dielectric layer 266 over the first and second dopant regions 220, 222 and first and second doped regions 224, 226. A sixth operation 326 can include forming a plurality of contact openings 269 within the first dielectric layer or BARC 266. A seventh operation 327 can include forming a first metal layer established through the contact openings 269 over or above the first and second doped regions 224, 226, where the first metal layer includes electrically connected grids to the first and second doped regions 224, 226 on the back side 204. A last operation 328 can include forming a second metal layer on the first metal layer, where the first metal layer electrically couples the second metal layer to the first and second doped regions 224, 226.

Figure 29:
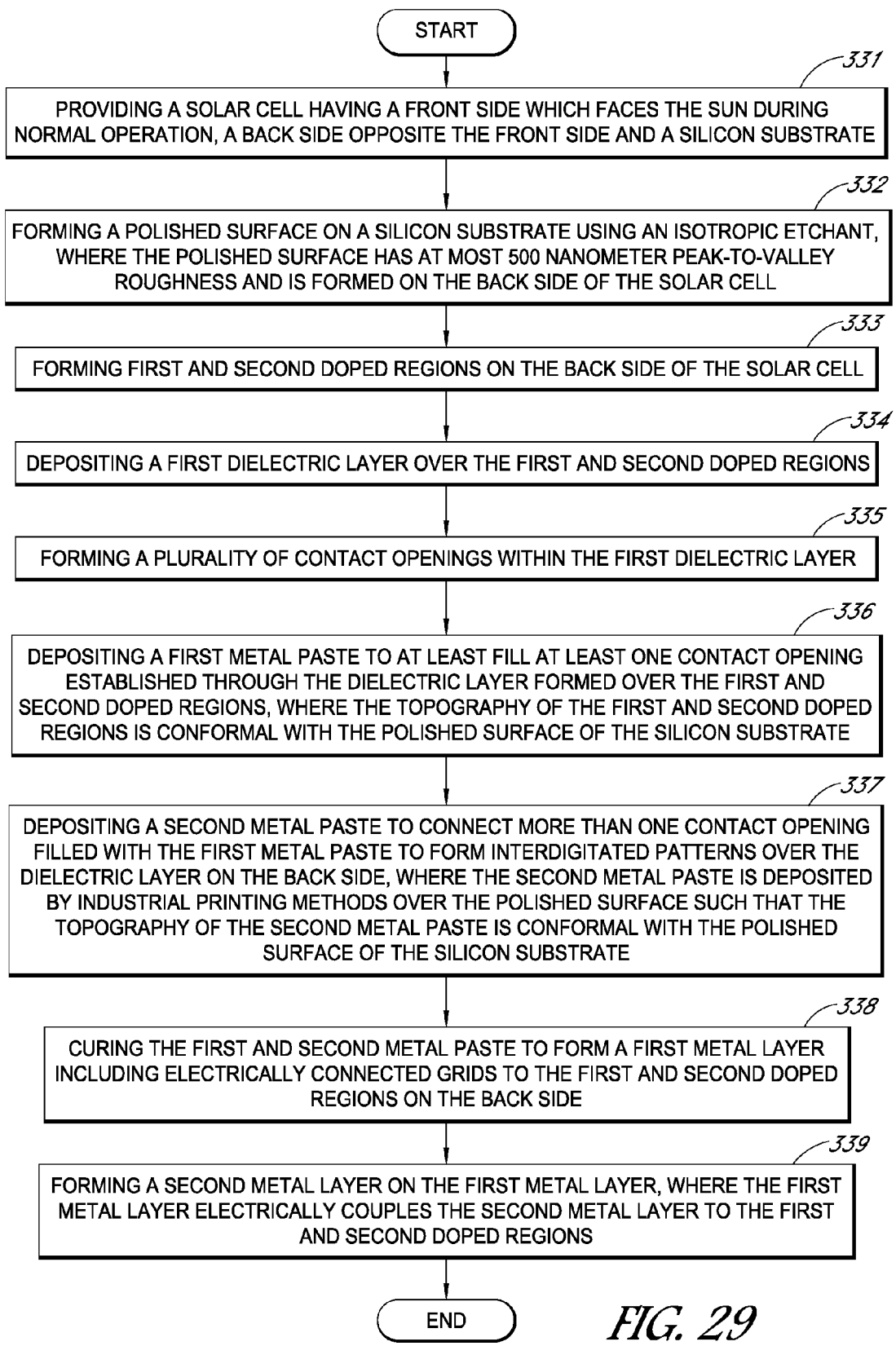

FIG. 29 illustrates a flowchart of an embodiment for a method of fabricating the solar cell as shown in FIGS. 14-25. As discussed above, a first operation 331 can include providing a solar cell 200 having a front side 202 which faces the sun during normal operation, a back side 204 opposite the front side 202 and a silicon substrate 210. The second operation 332 can include forming a polished surface 233 on a silicon substrate 210 using an isotropic etchant, where the polished surface 233 has at most 500 nanometer peak-to-valley roughness and is formed on the back side 204 of the solar cell 200. A third operation 333 can include forming first and second doped regions 224, 226 on the back side 204 of the solar cell 200. A fourth operation 334 can include depositing a first dielectric layer or BARC layer 266 over the first and second doped regions 224, 226. A fifth operation 335 can include forming a plurality of contact openings 269 within the first dielectric layer or BARC 266. A sixth operation 336 can include depositing a first metal paste 274 to at least fill at least one contact opening 269 established through the dielectric layer or BARC 266 formed over the first and second doped regions 224, 226, where the topography of the first and second doped regions 224, 226 is conformal with the polished surface 233 of the silicon substrate 210. A seventh operation 337 can include depositing a second metal paste 276 to connect more than one contact opening 269 filled with the first metal paste 274 to form interdigitated patterns over the dielectric layer 266 on the back side 204, where the second metal paste 276 is deposited by industrial printing methods over the polished surface 233 such that the topography of the second metal paste 276 is conformal with the polished surface 233 of the silicon substrate 210. An eighth operation 338 can include curing the first and second metal paste 274, 276 to form a first metal layer including electrically connected grids to the first and second doped regions 224, 226 on the back side 204. The last operation 339 can include forming a second metal layer on the first metal layer, where the first metal layer electrically couples the second metal layer to the first and second doped regions 224, 226.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a solar cell, the solar cell having a front side which faces the sun during normal operation and a back side opposite the front side, the method comprising:
    forming a polished surface on a silicon substrate using an etchant, wherein the polished surface has at most 500 nanometer peak-to-valley roughness and is formed on the back side of the solar cell;
    depositing first and second dopant material, each dopant material having a viscosity in the range of 1-25 centipoise (cP), in an interdigitated pattern on the polished surface, the first and second dopant materials comprising a first and second dopant source, respectively, wherein the polished surface allows the first and second dopant materials to form an interdigitated pattern comprising features of uniform thickness and width;
    heating the silicon substrate and the first and second dopant materials to a temperature sufficient to cause the first and second dopant sources to diffuse into the silicon substrate forming a first and second doped regions within the silicon substrate;
    depositing a first dielectric layer over the first and second doped regions;
    forming a plurality of contact openings within the first dielectric layer;
    forming a first metal layer established through the contact openings over the first and second doped regions, wherein the first metal layer comprises electrically connected grids to the first and second doped regions on the back side; and
    forming a second metal layer on the first metal layer, wherein the first metal layer electrically couples the second metal layer to the first and second doped regions.

2. The method of claim 1, wherein the silicon substrate is formed using a method selected from the group consisting of slurry wafering and diamond wire wafering processes.

3. The method of claim 1, wherein forming the polished surface comprises:
    etching the silicon substrate with an anisotropic etchant to form a smoothened surface; and
    subsequently etching the smoothened surface with an isotropic etchant to form a polished surface.

4. The method of claim 1, wherein forming the polished surface comprises etching the silicon substrate with an isotropic etchant.

5. The method of claim 1, wherein forming the polished surface on the silicon substrate comprises etching a silicon substrate using a chemical etchant selected from the group consisting of sulfuric acid ($H_2SO_4$), acetic acid ($CHO_3COOH$), nitric acid ($HNO_3$), hydrofluoric acid (HF) and phosphoric acid ($H_3PO_4$).

6. The method of claim 1, wherein the silicon substrate is formed using a method selected from the group consisting of slurry wafering and diamond wire wafering processes, and wherein forming the polished surface comprises etching the silicon substrate with an isotropic etchant.

7. The method of claim 1, wherein the silicon substrate is formed using a method selected from the group consisting of slurry wafering and diamond wire wafering processes, and wherein forming the polished surface on the silicon substrate comprises etching a silicon substrate using a chemical etchant selected from the group consisting of sulfuric acid ($H_2SO_4$), acetic acid ($CH_3COOH$), nitric acid ($HNO_3$), hydrofluoric acid (HF) and phosphoric acid ($H_3PO_4$).

8. The method of claim 1, wherein the silicon substrate is formed using a method selected from the group consisting of slurry wafering and diamond wire wafering processes, and wherein forming the polished surface comprises:
    etching the silicon substrate with an anisotropic etchant to form a smoothened surface; and
    subsequently etching the smoothened surface with an isotropic etchant to form a polished surface.

9. A method of fabricating a solar cell, the solar cell having a front side which faces the sun during normal operation and a back side opposite the front side, the method comprising:
    forming a polished surface on a silicon substrate using an isotropic etchant, wherein the polished surface has at most 500 nanometer peak-to-valley roughness and is formed on the back side of the solar cell;
    forming first and second doped regions on the back side of the solar cell;
    depositing a first dielectric layer over the first and second doped regions;
    forming a plurality of contact openings within the first dielectric layer;
    depositing a first metal paste to at least fill at least one contact opening established through the dielectric layer formed over the first and second doped regions, wherein the topography of the first and second doped regions is conformal with the polished surface of the silicon substrate;
    depositing a second metal paste to connect more than one contact opening filled with the first metal paste to form interdigitated patterns over the dielectric layer on the back side, wherein the second metal paste is deposited by industrial printing methods over the polished surface such that the topography of the second metal paste is conformal with the polished surface of the silicon substrate;
    curing the first and second metal paste to form a first metal layer comprising electrically connected grids to the first and second doped regions on the back side; and forming a second metal layer on the first metal layer, wherein the first metal layer electrically couples the second metal layer to the first and second doped regions.

10. The method of claim 9, wherein the silicon substrate is formed using a method selected from the group consisting of slurry wafering and diamond wire wafering processes.

11. The method of claim 9, wherein forming the polished surface on the silicon substrate comprises etching a silicon substrate using a chemical etchant selected from the group consisting of sulfuric acid ($H_2SO_4$), acetic acid ($CH_3COOH$), nitric acid ($HNO_3$), hydrofluoric acid (HF) and phosphoric acid ($H_3PO_4$).

12. The method of claim 9, wherein the silicon substrate is formed using a method selected from the group consisting of slurry wafering and diamond wire wafering processes, and wherein forming the polished surface on the silicon substrate comprises etching a silicon substrate using a chemical etchant selected from the group consisting of sulfuric acid ($H_2SO_4$), acetic acid ($CH_3COOH$), nitric acid ($HNO_3$), hydrofluoric acid (HF) and phosphoric acid ($H_3PO_4$).

13. A method of fabricating a solar cell, the solar cell having a front side which faces the sun during normal operation and a back side opposite the front side, the method comprising:
    forming a polished surface on a silicon layer using an etchant, wherein the polished surface has at most 500 nanometer peak-to-valley roughness and is formed on the back side of the solar cell;
    depositing first and second dopant material, each dopant material having a viscosity in the range of 1-25 centipoise (cP), in an interdigitated pattern on the polished surface, the first and second dopant materials comprising a first and second dopant source, respectively, wherein the polished surface allows the first and second dopant materials to form an interdigitated pattern comprising features of uniform thickness and width;
    heating the silicon layer and the first and second dopant materials to a temperature sufficient to cause the first and second dopant sources to diffuse into the silicon layer forming a first and second doped regions within the silicon layer;
    depositing a first dielectric layer over the first and second doped regions;
    forming a plurality of contact openings within the first dielectric layer;
    forming a first metal layer established through the contact openings over the first and second doped regions, wherein the first metal layer comprises electrically connected grids to the first and second doped regions on the back side; and
    forming a second metal layer on the first metal layer, wherein the first metal layer electrically couples the second metal layer to the first and second doped regions.

14. The method of claim 13, wherein the silicon layer is formed using a method selected from the group consisting of slurry wafering and diamond wire wafering processes.

15. The method of claim 13, wherein forming the polished surface comprises:
    etching the silicon layer with an anisotropic etchant to form a smoothened surface; and
    subsequently etching the smoothened surface with an isotropic etchant to form a polished surface.

16. The method of claim 13, wherein forming the polished surface comprises etching the silicon layer with an isotropic etchant.

17. The method of claim 13, wherein forming the polished surface on the silicon layer comprises etching a silicon layer using a chemical etchant selected from the group consisting of sulfuric acid ($H_2SO_4$), acetic acid ($CH_3COOH$), nitric acid ($HNO_3$), hydrofluoric acid (HF) and phosphoric acid ($H_3PO_4$).

18. The method of claim 13, wherein the silicon layer is formed using a method selected from the group consisting of slurry wafering and diamond wire wafering processes, and wherein forming the polished surface comprises etching the silicon layer with an isotropic etchant.

19. The method of claim 13, wherein the silicon layer is formed using a method selected from the group consisting of slurry wafering and diamond wire wafering processes, and wherein forming the polished surface on the silicon layer comprises etching a silicon layer using a chemical etchant selected from the group consisting of sulfuric acid ($H_2SO_4$), acetic acid ($CH_3COOH$), nitric acid ($HNO_3$), hydrofluoric acid (HF) and phosphoric acid ($H_3PO_4$).

20. The method of claim 13, wherein the silicon layer is formed using a method selected from the group consisting of slurry wafering and diamond wire wafering processes, and wherein forming the polished surface comprises:
    etching the silicon layer with an anisotropic etchant to form a smoothened surface; and
    subsequently etching the smoothened surface with an isotropic etchant to form a polished surface.

* * * * *